(12) United States Patent
Lee

(10) Patent No.: US 7,545,685 B2
(45) Date of Patent: Jun. 9, 2009

(54) HIGH VOLTAGE SWITCH CIRCUIT HAVING BOOSTING CIRCUIT AND FLASH MEMORY DEVICE INCLUDING THE SAME

(75) Inventor: Seok Joo Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 153 days.

(21) Appl. No.: 11/480,341

(22) Filed: Jun. 30, 2006

(65) Prior Publication Data
US 2007/0223289 A1 Sep. 27, 2007

(30) Foreign Application Priority Data
Mar. 27, 2006 (KR) .................. 10-2006-0027408

(51) Int. Cl.
*G11C 7/00* (2006.01)
(52) U.S. Cl. .............. 365/189.11; 327/51; 327/52; 327/53; 327/54; 327/55; 327/56; 327/57; 327/333; 327/535; 327/536; 327/589; 327/534; 327/537
(58) Field of Classification Search ............ 327/51–57, 327/333, 589, 534–537; 365/189.11 O, 189.11
See application file for complete search history.

(56) References Cited

U.S. PATENT DOCUMENTS 7,233,193 B2 * 6/2007 Kim ........................ 327/534

7,282,956 B2 * 10/2007 Lee ........................... 326/88

FOREIGN PATENT DOCUMENTS

| JP | 2003-196980 | 7/2003 |
| KR | 1999-0057346 | 7/1999 |
| KR | 1020020016320 A | 3/2002 |

* cited by examiner

*Primary Examiner*—VanThu Nguyen
(74) *Attorney, Agent, or Firm*—Townsend and Townsend and Crew LLP

(57) ABSTRACT

A high-voltage switch circuit includes an enable control circuit, a feedback circuit, a boosting circuit, and a high voltage switch. The enable control circuit precharges an output node to a set voltage in response to an enable signal. The feedback circuit supplies a feedback voltage to an input node in response to a switch control voltage generated from the output node when the output node is precharged. The boosting circuit boosts the feedback voltage and outputs a boosting voltage to the output node, in response to clock signals, thereby increasing the switch control voltage. The high voltage switch is turned on or off in response to the switch control voltage, and is turned on to receive a high voltage and output the received high voltage. The boosting circuit includes an amplification circuit of a cross-coupled type.

28 Claims, 17 Drawing Sheets

HIGH VOLTAGE SWITCH CIRCUIT HAVING BOOSTING CIRCUIT AND FLASH MEMORY DEVICE INCLUDING THE SAME

BACKGROUND

The present invention relates to a semiconductor device and more particularly to a flash memory device including a high-voltage switch circuit which can increase the switching operating speed.

A high voltage semiconductor memory device includes a high-voltage switch circuit. The high-voltage switch circuit supplies or cuts off the high voltage to an internal circuit requiring the high voltage in response to a switch control voltage.

FIG. 1 is a circuit diagram of a high-voltage switch circuit in the related art. A high-voltage switch circuit 10 includes an enable control circuit 11, a high voltage switch 12, and a boosting circuit 13. The enable control circuit 11 and the high voltage switch 12 may be implemented using a high voltage NMOS transistor. Hereinafter, it is assumed that each of the enable control circuit 11 and the high voltage switch 12 is an NMOS transistor. The boosting circuit 13 includes NMOS transistors N1, N2 and capacitors C1, C2.

The operation process of the high-voltage switch circuit 10 will be described in short below. If an enable signal EN is set to VCC, the NMOS transistor 11 supplies an output node OUT with VCC−Vth1, where Vth1 is the threshold voltage of the NMOS transistor 11. As a result, a voltage VCC−Vth1 is generated by the switch control voltage VO onto the output node OUT.

The NMOS transistor N1 is turned on in response to the switch control voltage VO and outputs an internal output voltage VINT=VCC−Vth1−Vth2, where Vth2 is the threshold voltage of the NMOS transistor N1. At this time, a logic high clock signal CLK is input to the capacitor C1. Consequently, the internal output voltage VINT can be expressed by the following Equation.

$$VINT = \left(1 + \frac{C_c1}{C_c1 + C_s1}\right)VCC - Vth1 - Vth2 \quad \text{[Equation 1]}$$

(where $C_c1$ is capacitance of C1 and $C_s1$ is capacitance of CE)

In Equation 1, CE denotes a parasitic capacitor existing in the node A. When the clock signal CLK goes high, an inverted clock signal CLKB goes low (e.g., a voltage VSS). Thereafter, the diode-connected NMOS transistor N2 is turned on in response to the internal output voltage VINT and outputs the internal output voltage VINT to the output node OUT. The NMOS transistor N2 may be implemented using a low-voltage transistor. Accordingly, since the threshold voltage of the NMOS transistor N2 is significantly smaller than the threshold voltage Vth2 of the NMOS transistor N1, the voltage drop in the internal output voltage VINT by the NMOS transistor N2 can be ignored.

Meanwhile, the inverted clock signal CLKB is input to the capacitor C2 as logic high (VCC). As a result, the switch control voltage VO is boosted by the internal output voltage VINT and the voltage VCC of the inverted clock signal CLKB, as represented by the following Equation.

$$VO = VINT + \left(\frac{C_c2}{C_c2 + C_s2}\right)VCC \quad \text{[Equation 2]}$$

(where $C_c2$ is capacitance of C2 and $C_s2$ is capacitance of CF)

In Equation 2, CF is a parasitic capacitor existing in the output node OUT. When the inverted clock signal CLKB goes high, the clock signal CLK goes low. Thereafter, an increased switch control voltage VO is input to the gate of the NMOS transistor N1 again. The high-voltage switch circuit 10 then repeats the above-mentioned operations until the switch control voltage VO is boosted to a voltage VPP+Vth3, where VPP>>VCC and Vth3 is the threshold voltage of the NMOS transistor 12. When VO reaches VPP+Vth3 the NMOS transistor 12 is fully turned on and there is no voltage drop across NMOS transistor 12 when VPP is output to high-voltage HVOUT.

The NMOS transistor N1 included in the boosting circuit 13 is implemented using a high-voltage transistor since it receives the high voltage VPP. However, the threshold voltage of the high-voltage transistor is much higher than that of the low-voltage transistor. Accordingly, if the NMOS transistor N1 is implemented with the high-voltage transistor, a voltage dropped by the NMOS transistor N1 is much higher than that dropped by the low-voltage transistor.

If a voltage dropped by the NMOS transistor N1 is increased as described above, the internal output voltage VINT decreases and the boosting speed of the switch control voltage VO is decreased. As a result, a time T2 from when the enable signal EN is enabled to when the high-voltage switch circuit 10 (i.e., the NMOS transistor 12) is fully turned on is increased.

In addition, if the voltage VPP input to the drain of the NMOS transistor N1 increases, there is a possibility that the switch control voltage VO may not be normally boosted because the threshold voltages of the NMOS transistors N1, N2 are excessively increased due to the body effect of the NMOS transistors N1, N2. In this case, the high-voltage switch circuit 10 cannot perform the switching operation normally.

Furthermore, in the high-voltage switch circuit 10, the switch control voltage VO of the output node OUT is boosted directly by the inverted clock signal CLKB. Accordingly, as shown in FIG. 2, the switch control voltage VO includes noise components generated as the inverted clock signal CLKB is toggled. The noise components of the switch control voltage VO have a direct effect on the high-voltage HVOUT, and the high-voltage HVOUT also include the noise components as shown in FIG. 2.

Meanwhile, the amplitudes of the clock signal CLK and the inverted clock signal CLKB may be reduced in order to reduce the noise components of the high-voltage HVOUT. If the amplitudes of the clock signal CLK and the inverted clock signal CLKB are reduced, the boosting speed of the switch control voltage VO is decreased and in-turn the operating speed of the high-voltage switch circuit 10 is also decreased.

SUMMARY OF THE INVENTION

An embodiment of the present invention provides a high-voltage switch circuit, in which a switch control voltage can be boosted at high speed by a cross-coupled boosting circuit, increasing the switching operating speed and reducing noise components of a high voltage output. Such a circuit may be used in a flash memory device.

According to an aspect of the present invention, there is provided a high voltage switching circuit including an enable control circuit, a feedback circuit, a boosting circuit, and a high voltage switch. The enable control circuit precharges an output node to a set voltage in response to an enable signal. The feedback circuit supplies a feedback voltage to an input node in response to a switch control voltage generated from the output node when the output node is precharged. The boosting circuit boosts the feedback voltage and outputs a boosting voltage to the output node, in response to clock signals, thereby increasing the switch control voltage. The high voltage switch is turned on or off in response to the switch control voltage, and is turned on to receive a high voltage and output the received high voltage. The boosting circuit includes a cross-coupled amplification circuit or a plurality of cross coupled amplification circuits.

According to further another aspect of the present invention, there is provided a flash memory device including a plurality of memory cell blocks, an X-decoder, a plurality of block selection units, a plurality of gate circuits, a first pump, a second pump, a voltage selection circuit, a first high-voltage switch circuit, and a second high-voltage switch circuit. Each memory cell block includes a plurality of memory cells sharing local word lines and bit lines. The X-decoder decodes a row address signal and outputs first decoding signals and second decoding signal. The block selection units output block selection signals, in response to the first decoding signals. The gate circuits connect a global drain selection line, a global source select line, and global word lines to local drain selection lines, local source select lines, and the local word lines of the memory cell blocks, respectively, in response to the plurality of block selection signals. The first pump generates a program voltage in response to a program command. The second pump generates a program pass voltage in response to the program command. The voltage selection circuit selects at least one of the global word lines, and supplies the program voltage to the selected global word line, and the program pass voltage to the remaining global word lines, in response to the second decoding signal. The first high-voltage switch circuit supplies the program voltage to the voltage selection circuit in response to an enable control signal and the clock signals. The second high-voltage switch circuit supplies the program pass voltage to the voltage selection circuit in response to the enable control signal and the clock signals. Each of the block selection units includes; a block switch for receiving the program voltage, and outputting one of the plurality of block selection signals as a voltage level higher than that of the program voltage or a voltage level lower than that of the program voltage in response to a block switch control voltage; and a third high-voltage switch circuit for receiving the program voltage, and outputting the program voltage as the block switch control voltage in response to one of the first decoding signals and the clock signals. Furthermore, each of the first to third high-voltage switch circuits includes a cross-coupled amplification circuit.

BRIEF DESCRIPTION OF THE DRAWINGS

A more complete appreciation of the invention, and many of the attendant advantages thereof, will be readily apparent and become better understood with reference to the following detailed description when considered in conjunction with the accompanying drawings in which like reference symbols indicate the same or similar components, wherein.

DETAILED DESCRIPTION OF EMBODIMENTS

Figure 3:
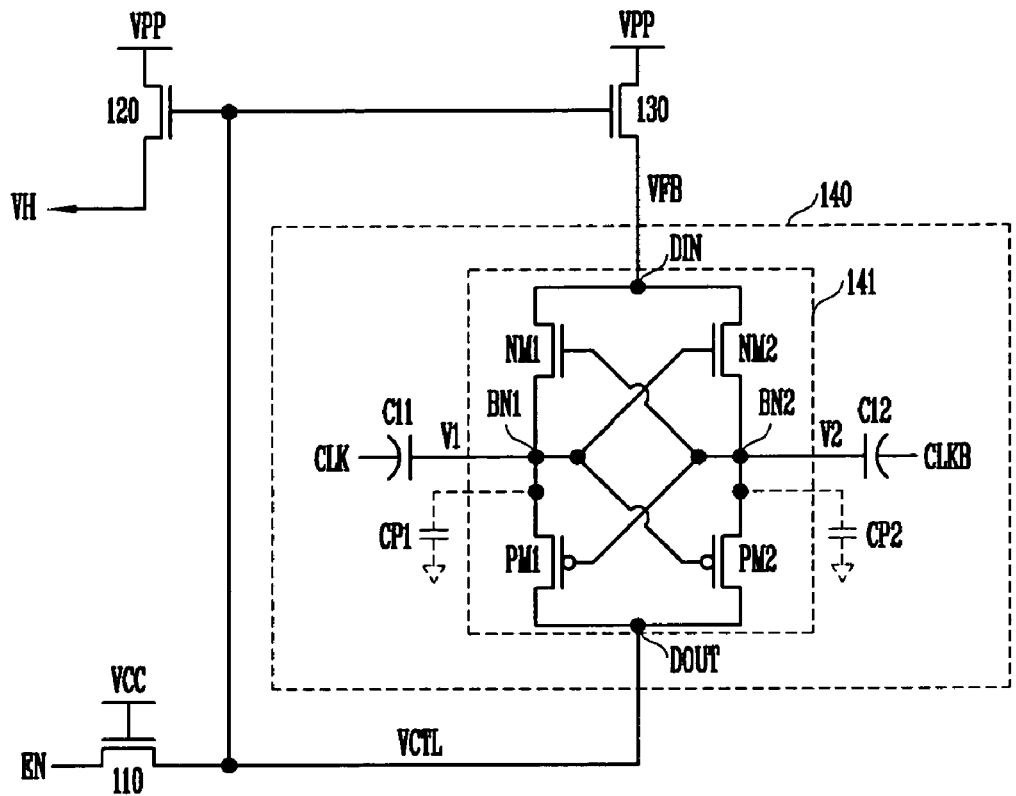
FIG. 3 is a circuit diagram of a high-voltage switch circuit according to one embodiment of the present invention.

FIG. 3 is a circuit diagram of a high-voltage switch circuit according to one embodiment of the present invention. Referring to FIG. 3, a high-voltage switch circuit 100 includes an enable control circuit 110, a high voltage switch 120, a feedback circuit 130, and a boosting circuit 140.

The enable control circuit 110 percharges an output node DOUT to a set voltage in response to an enable signal EN. The enable control circuit 110 may be implemented using a high voltage NMOS transistor. Hereinafter, it is assumed that the enable control circuit 110 is an NMOS transistor for illustrative convenience. The NMOS transistor 110 has a drain to which the enable signal EN is input, a gate to which an internal voltage VCC is input, and a source connected to the output node DOUT. When the enable signal EN=VCC, the NMOS transistor 110 supplies a voltage (VCC−Vt1) to the output node DOUT, where Vt1 is a threshold voltage of the NMOS transistor 110. The switch control voltage VCTL equals the output node DOUT, since they are on the same line. Furthermore, when the enable signal EN has a ground voltage VSS, the NMOS transistor 110 discharges the output node DOUT to the ground voltage VSS.

The high voltage switch 120 is turned on or off in response to a switch control voltage VCTL. The high voltage switch 120 may be implemented using a high voltage NMOS transistor. Hereinafter, it is assumed that the high voltage switch 120 is an NMOS transistor for illustrative purpose. The NMOS transistor 120 has a drain to which a high voltage VPP is input and a gate to which the switch control voltage VCTL is input. When the switch control voltage VCTL is equal to VPP+Vt2, where Vt2 is a threshold voltage of the NMOS transistor 120, the NMOS transistor 120 is fully turned on and high voltage VH=VPP without a voltage drop.

The feedback circuit 130 supplies a feedback voltage VFB to an input node DIN in response to the switch control voltage VCTL when the output node DOUT=VCC−Vt1. The feedback circuit 130 may be implemented using a high voltage NMOS transistor. Hereinafter, it is assumed that the feedback circuit 130 is an NMOS transistor for illustrative purpose. The NMOS transistor 130 has a drain to which the high voltage VPP is input, a gate to which the switch control voltage VCTL is input, and a source connected to the input node DIN. Furthermore, the NMOS transistor 130 is turned on or off in response to the switch control voltage VCTL. The NMOS transistor 130 is turned on by the switch control voltage VCTL to output a feedback voltage VFB to the input node DIN.

The boosting circuit 140 includes a cross-coupled amplification circuit 141 and capacitors C11, C12. The amplification circuit 141 includes switches NM1, NM2, PM1, and PM2. Preferably, each of the switches NM1, NM2 may be implemented using a low-voltage NMOS transistor and each of the switches PM1, PM2 may be implemented using a low-voltage PMOS transistor. Hereinafter, it is assumed that each of the switches NM1, NM2 is an NMOS transistor and each of the switches PM1, PM2 is a PMOS transistor.

The NMOS transistors NM1, NM2 have drains connected to the input node DIN. The NMOS transistors NM1, NM2 have sources respectively connected to boosting nodes BN1, BN2. The NMOS transistor NM1 has a gate connected to the boosting node BN2. The NMOS transistor NM1 is turned on or off in response to a boosting voltage V2 of the boosting node BN2. The NMOS transistor NM2 has a gate connected to the boosting node BN1. The NMOS transistor NM2 is turned on or off in response to a boosting voltage V1 of the boosting node BN1.

The PMOS transistors PM1, PM2 have sources and drains connected to the output node DOUT and the boosting nodes BN1, BN2. The PMOS transistor PM1 has a gate connected to the boosting node BN2. The PMOS transistor PM1 is turned on or off in response to the boosting voltage V2. The PMOS transistor PM2 has a gate connected to the boosting node BN1. The PMOS transistor PM2 is turned on or off in response to the boosting voltage V1.

The capacitor C11 is connected to the boosting node BN1 and is charged or discharged in response to a clock signal CLK. When the clock signal CLK has a voltage VCC, the capacitor C11 is charged. When the clock signal CLK has a voltage VSS (or ground voltage), the capacitor C11 is discharged.

The capacitor C12 is connected to the boosting node BN2 and is charged or discharged in response to the inverted clock signal CLKB. When the inverted clock signal CLKB has a voltage VCC, the capacitor C12 is charged. When the inverted clock signal CLKB has a voltage VSS (or grounded), the capacitor C12 is discharged. The clock signals CLK and the inverted clock signal CLKB are complementary.

The operation process of the high-voltage switch circuit 101 will be described in more detail below. If the enable signal EN is first enabled, the enable control circuit 110 supplies the output node DOUT with VCC−Vt1. As a result, the switch control voltage VCTL, which is equal to VCC−Vt1, is applied to the output node DOUT. The NMOS transistors 120, 130 are partially turned on in response to the switch control voltage VCTL. At this time, the high voltage VH output from the NMOS transistor 120 and the feedback voltage VFB output from the NMOS transistor 130 can be expressed by the following equations.

$$VH = VCTL - Vt2,$$

$$VFB = VCTL - Vt3,$$

$$VCTL = VCC - Vt1 \qquad \text{Equation 3}$$

(where Vt3 is the threshold voltage of the NMOS transistor 130).

Figure 4:
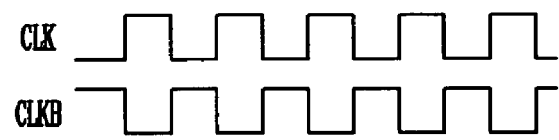
FIG. 4 is a timing diagram of signals related to the operation of the high-voltage switch circuit shown in FIG. 3.
Figure 4:
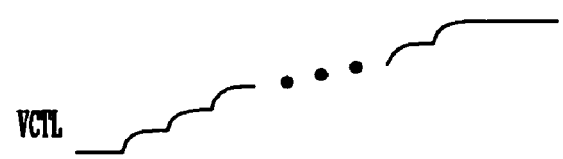

Meanwhile, as shown in FIG. 4, initially, the clock signal CLK is at VCC and the inverted clock signal CLKB is at VSS. The capacitor C11 is charged in response to the clock signal CLK and the capacitor C12 is discharged in response to the inverted clock signal CLKB. As a result, the boosting voltage V2 of the boosting node BN2 becomes the ground voltage VSS. Furthermore, the NMOS transistor NM1 is turned off and the PMOS transistor PM1 is turned on, in response to the boosting voltage V2. Since the NMOS transistor NM1 remains turned off, the feedback voltage VFB is not supplied to the boosting node BN1. At this time, the boosting voltage V1 of the boosting node BN1 can be expressed as follows.

$$V1 = \left(\frac{C_H 1}{C_H 1 + C_I 1}\right) VCC \qquad [\text{Equation 4}]$$

(where $C_H 1$ is capacitance of C11 and $C_I 1$ is capacitance of CP1)

In Equation 4, CP1 is a parasitic capacitor existing in the boosting node BN1. The PMOS transistor PM1 outputs the boosting voltage V1 to the output node DOUT. As a result, the switch control voltage VCTL is increased by as much as the boosting voltage V1. Furthermore, the NMOS transistor NM2 is turned on and the PMOS transistor PM2 is turned off, in response to the boosting voltage V1.

The NMOS transistor NM2 outputs the feedback voltage VFB, which is received from the input node DIN, to the boosting node BN2. The NMOS transistor NM2 is a low-voltage transistor and the voltage drop of the feedback voltage VFB by the NMOS transistor NM2 can be ignored. As a result, the boosting voltage V2 is boosted by the feedback voltage VFB and the voltage VCC of the inverted clock signal CLKB, and its boosted boosting voltage V2 can be expressed by the following Equation.

$$V2 = VFB + \left(\frac{C_H 2}{C_H 2 + C_I 2}\right) VCC \qquad [\text{Equation 5}]$$

(where $C_H 2$ is capacitance of C12 and $C_I 2$ is capacitance of CP2)

In Equation 5, CP2 is a parasitic capacitor existing in the boosting node BN2. Thereafter, the clock signal CLK is low and the inverted clock signal CLKB is high. The capacitor C11 is discharged in response to the clock signal CLK and the capacitor C12 is charged in response to the inverted clock signal CLKB. As a result, the first boosting voltage V1=VSS. The NMOS transistor NM2 is turned off in response to the first boosting voltage V1, cutting off the feedback voltage VFB to the boosting node BN2. Furthermore, the PMOS transistor PM2 is turned on in response to the first boosting voltage V1, thus outputting the boosting voltage V2 to the output node DOUT. As a result, the switch control voltage VCTL is increased by as much as the boosting voltage V2.

On the other hand, as the boosting voltage V2 is boosted, the NMOS transistor NM1 is turned on and the PMOS transistor PM1 is turned off, in response to the boosting voltage V2. The NMOS transistor NM1 supplies the feedback voltage VFB to the boosting node BN1. In this case, the feedback voltage VFB has been increased by as much as the boosting voltage V2 compared with when it was supplied to the boosting node BN2 as the NMOS transistor NM2 was turned on. This is because the PMOS transistor PM2 outputs the boosting voltage V2 to the output node DOUT. In other words, the turn-on resistance of the NMOS transistor 130 decreases in proportion to an increase of the switch control voltage VCTL. Accordingly, the higher the switch control voltage VCTL, the higher the feedback voltage VFB.

Meanwhile, the clock signal CLK is high and the inverted clock signal CLKB is low. The capacitor C12 is discharged in response to the inverted clock signal CLKB and the capacitor C11 is charged in response to the clock signal CLK. As a result, the boosting voltage V2 of the boosting node BN2 becomes the ground voltage VSS. The NMOS transistor NM1 is turned off in response to the boosting voltage V2, thus cutting off the feedback voltage VFB. Furthermore, the PMOS transistor PM1 is turned on in response to the boosting voltage V2.

Consequently, the boosting voltage V1 of the boosting node BN1 is boosted by the feedback voltage VFB and the voltage VCC of the clock signal CLK. At this time, the boosting voltage V1 can be expressed as follows.

$$V1 = VFB + V2 + \left(\frac{C_H 1}{C_H 1 + C_I 1}\right)VCC \quad \text{[Equation 6]}$$

If Equation 3 to Equation 5 are substituted into Equation 6, the boosting voltage V1 can be expressed as follows.

$$\begin{aligned}V1 &= VFB + V2 + \left(\frac{C_H 1}{C_H 1 + C_I 1}\right)VCC \quad \text{[Equation 7]}\\ &= VFB + \left[VFB + \left(\frac{C_H 2}{C_H 2 + C_I 2}\right)VCC\right] + \left(\frac{C_H 1}{C_H 1 + C_I 1}\right)VCC\\ &= 2VFB + \left(\frac{C_H 2}{C_H 2 + C_I 2}\right)VCC + \left(\frac{C_H 1}{C_H 1 + C_I 1}\right)VCC\\ &= 2(VCC - Vt1 - Vt3) +\\ &\quad \left(\frac{C_H 2}{C_H 2 + C_I 2}\right)VCC + \left(\frac{C_H 1}{C_H 1 + C_I 1}\right)VCC\end{aligned}$$

m Equation 7, it can be seen that the boosting voltage V1 represented by Equation 7 is higher than the boosting voltage V1 represented by Equation 4.

Each time the clock signal CLK and the inverted clock signal CLKB are alternately enabled, the boosting voltages V1, V2 are alternately amplified and are then output to the output node DOUT. Accordingly, the switch control voltage VCTL is gradually increased as shown in FIG. 4. For example, when the clock signal CLK is high, the NMOS transistor NM2 and the PMOS transistor PM1 are turned on to amplify the boosting voltage V2. Furthermore, when the inverted clock signal CLKB is high, the NMOS transistor NM1 and the PMOS transistor PM2 are turned on to amplify the boosting voltage V1. As a result, when the switch control voltage VCTL is gradually increased to become a voltage VPP+Vt2 by the boosting circuit 140, the NMOS transistor 120 is fully turned on to output the high voltage VPP to the high voltage VH without a voltage drop.

Meanwhile, when the enable signal EN has the ground voltage VSS, the NMOS transistor 110 discharges the output node DOUT to the ground voltage VSS. As a result, the switch control voltage VCTL becomes VSS. Both the NMOS transistors 120, 130 are turned off in response to the switch control voltage VCTL. Accordingly, the high-voltage switch circuit 101 stops the switching operation of the high voltage VPP.

Figure 5:
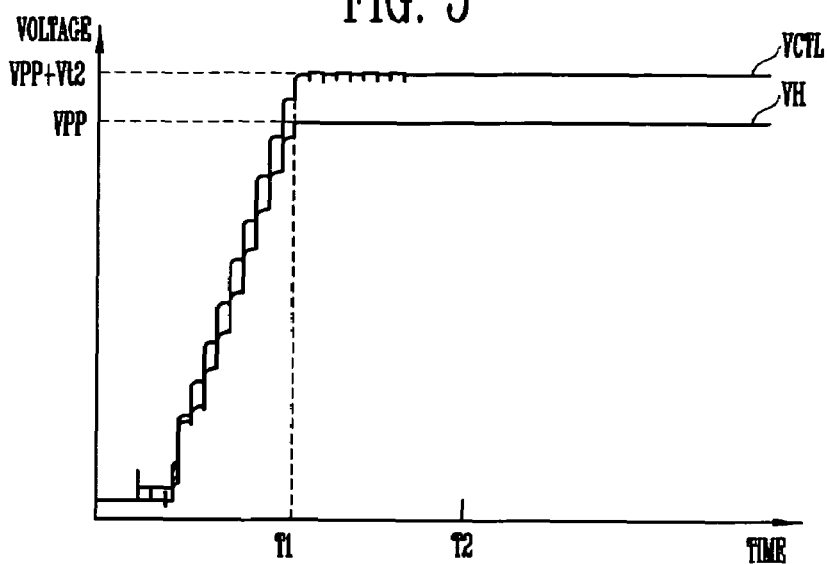
FIG. 5 is a graph showing the relationship between variation in a boosting control voltage and an output voltage in a high-voltage switch circuit shown in FIG. 3.

As described above, the cross-coupled amplification circuit 141 can increase the switch control voltage VCTL rapidly for a short period of time. Accordingly, the operating speed of the high-voltage switch circuit 101 can be increased. Furthermore, in the boosting circuit 140, since the clock signal CLK or the inverted clock signal CLKB is not input onto the output node DOUT, noise components of the switch control voltage VCTL can be reduced as shown in FIG. 5. As a result, noise components of the high voltage VH output from the high-voltage switch circuit 101 can be reduced.

Figure 1:
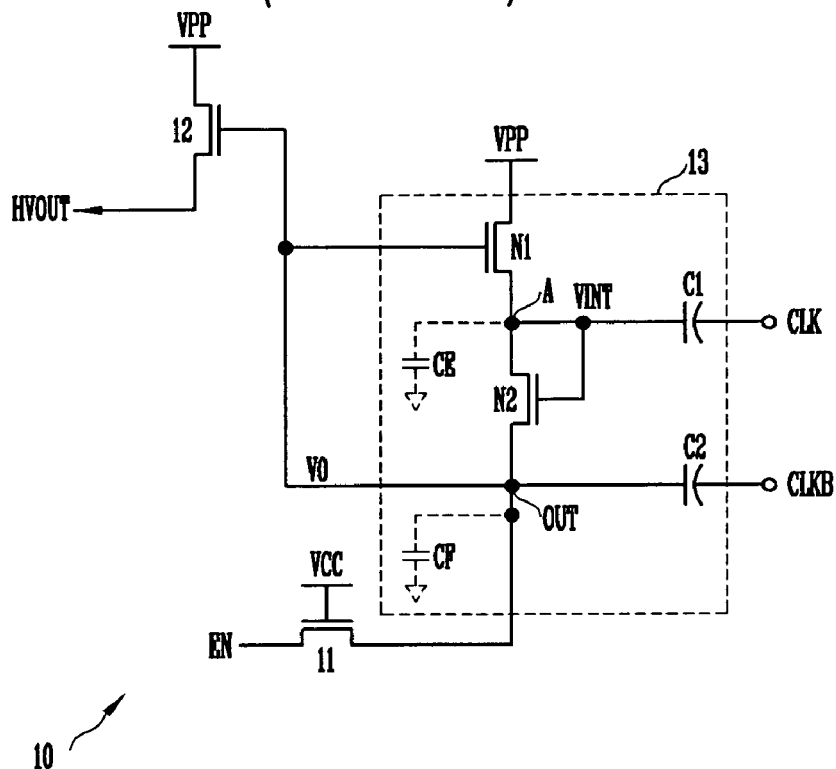
FIG. 1 is a circuit diagram of a high-voltage switch circuit in the related art.
Figure 2:
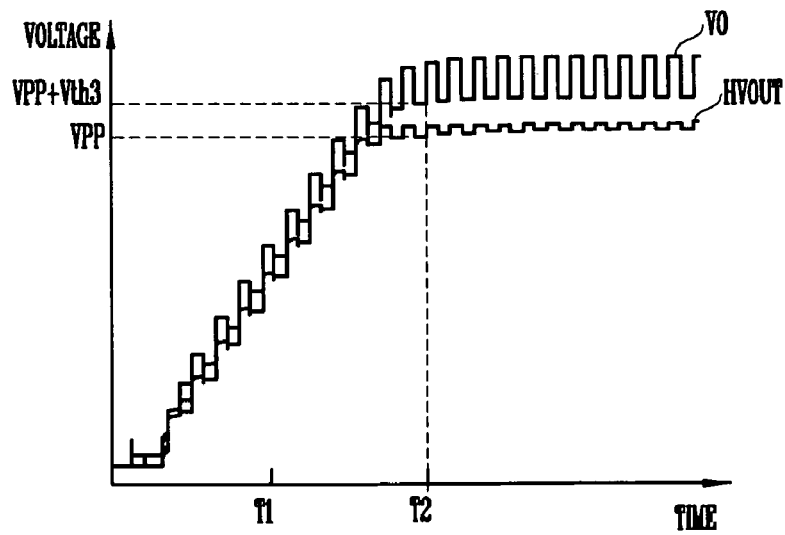
FIG. 2 is a graph showing the relationship between variation in a boosting control voltage and an output voltage in a high-voltage switch circuit shown in FIG. 1.

The effects of the high-voltage switch circuit 101 can become more evident when comparing the graphs shown in FIGS. 2 and 5. FIG. 5 is a graph showing the relationship between variation in the boosting control voltage and the output voltage by the operation of the high-voltage switch circuit shown in FIG. 3.

Referring to FIG. 5, it takes a time "T1" for the switch control voltage VCTL to equal VPP+Vt2 after the enable signal EN is enabled. Referring to FIG. 2, it takes a time "T2" for the switch control voltage VO to equal VPP+Vt3 after the enable signal EN is enabled. Accordingly, it can be seen that the time needed for the switch control voltage VCTL to reach VPP+Vt2 is reduced with the boosting circuit 140. As a result, the high-voltage switch circuit 101 can perform the switching operation at higher speeds.

Figure 6:
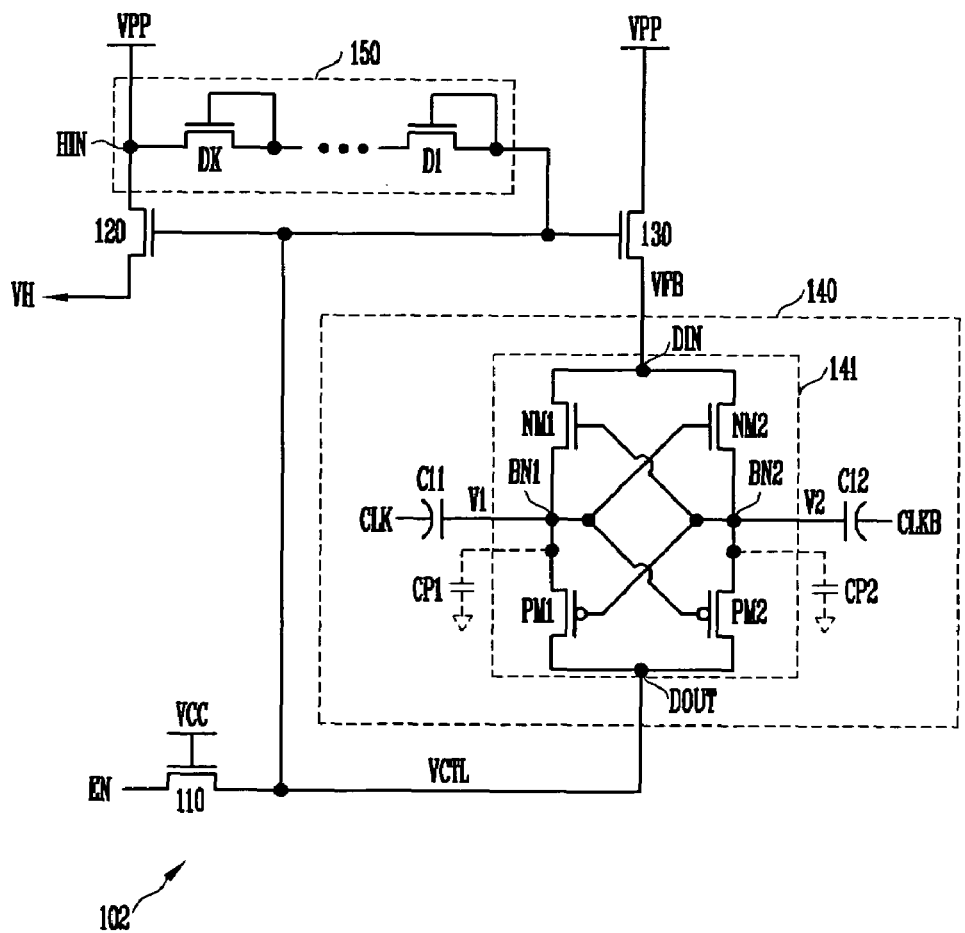
FIG. 6 is a circuit diagram of a high-voltage switch circuit according to one embodiment of the present invention.

FIG. 6 is a circuit diagram of a high-voltage switch circuit according to one embodiment of the present invention. Referring to FIG. 6, a high-voltage switch circuit 102 includes an enable control circuit 110, a high voltage switch 120, a feedback circuit 130, a boosting circuit 140, and a voltage limiter 150. The high-voltage switch circuit 102 has similar construction and operation as the high-voltage switch circuit 101 described in FIG. 3.

Below are some of the differences between the high voltage switch circuits 101, 102. The high voltage switch circuit 102 has the voltage limiter 150 connected to an output node DOUT, and it limits the switch control voltage VCTL (e.g., VPP+Vt2) so that the switch control voltage VCTL is not excessively boosted. The voltage limiter 150 includes self-biased NMOS transistors or diodes, which are connected in series between the output node DOUT and a high-voltage input node HIN. The voltage limiter 150 in FIG. 6 uses NMOS transistors D1 to DK, where K is an integer.

Transistors D1 to DK are connected in a transistor chain, with the drain of D1 connected to the output node DOUT and the source of DK connected to the high-voltage input node HIN. Each transistor is also diode-connected, where the gate terminal is shorted to the drain terminal.

If the switching control voltage VCTL exceeds the voltage limit, the NMOS transistors D1 to DK are turned on. The NMOS transistors D1 to DK are turned on to form a current path from the output node DOUT to the high-voltage input node HIN, thus reducing the switching control voltage VCTL. Since the high-voltage switch circuit 102 includes the voltage limiter 150 as described above, the switch control voltage VCTL may be prevented from exceeding a target voltage level.

Figure 7:
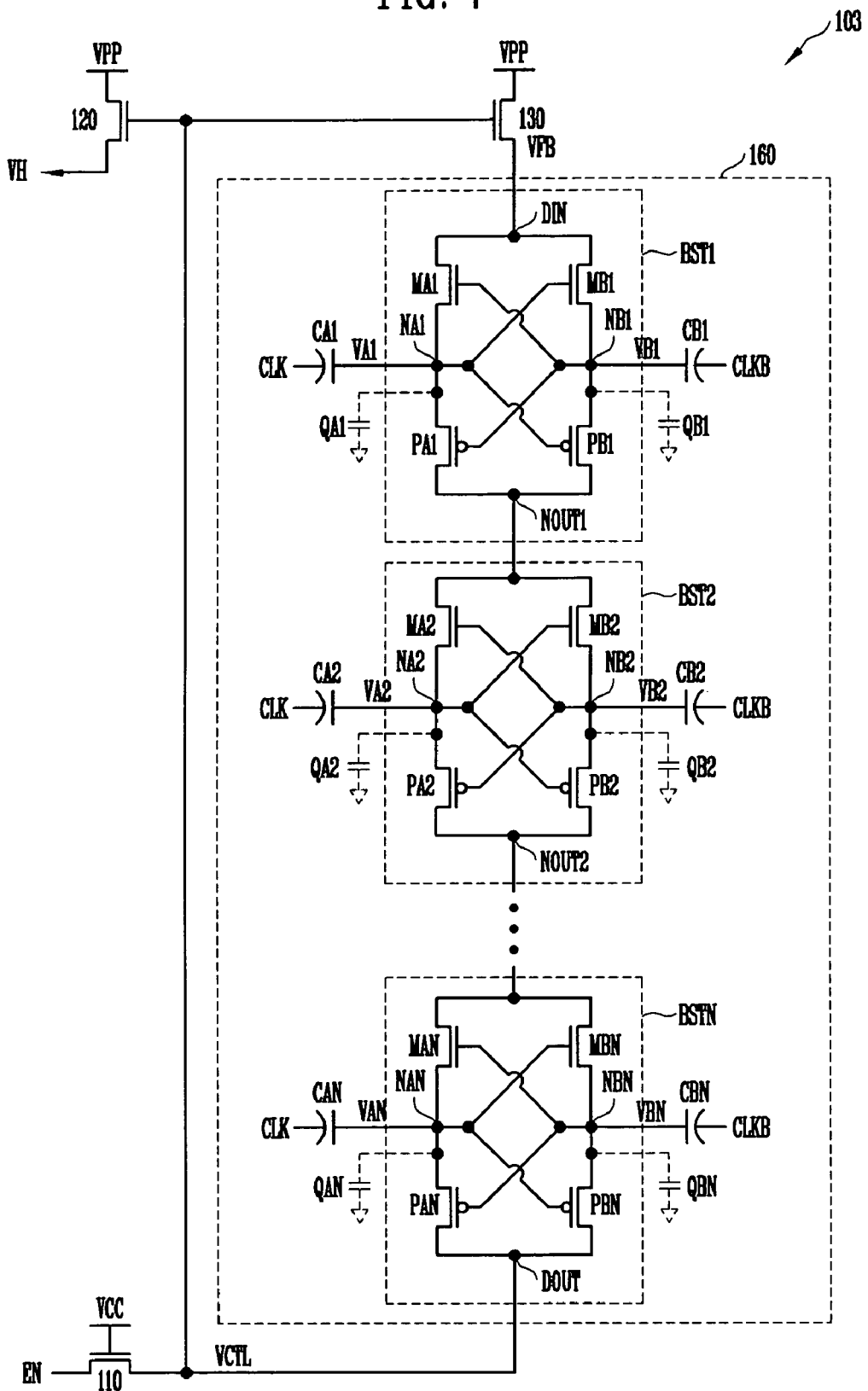
FIG. 7 is a circuit diagram of a high-voltage switch circuit according to one embodiment of the present invention.

FIG. 7 is a circuit diagram of a high-voltage switch circuit according to one embodiment of the present invention. Referring to FIG. 7, a high-voltage switch circuit 103 includes an enable control circuit 110, a high voltage switch 120, a feedback circuit 130, and a boosting circuit 160. The high-voltage switch circuit 103 has similar construction and operation as the high-voltage switch circuit 101 that has been described in FIG. 3.

Below are some of the differences between the high-voltage switch circuits 101 and 103. The d high-voltage switch circuit 103 has multiple amplification circuits BST1 to BSTN (N is an integer) and a plurality of capacitors CA1 to CAN, CB1 to CBN (N is an integer) in the boosting circuit 160 of the high-voltage switch circuit 103. The circuits BST1 to BSTN are connected in series, where the output node of BST1 is connected to the input node of BST2 and so on. The capacitors CA1 to CAN are connected to boosting nodes NA1 to NAN (N is an integer) of the amplification circuits BST1 to BSTN, respectively. The capacitors CB1 to CBN are connected to boosting nodes NB1 to NBN (N is an integer) of the amplification circuits BST1 to BSTN, respectively. The amplification circuits BST1 to BSTN have substantially the same construction as the amplification circuit 141 described in FIG. 3.

Since the boosting circuit 160 includes the plurality of amplification circuits BST1 to BSTN as described above, the boosting circuit 160 can increase the switch control voltage VCTL more rapidly than the boosting circuit 140. Consequently, the operating speed of the high-voltage switch circuit 103 is faster than that of the high-voltage switch circuit 101.

Figure 8:
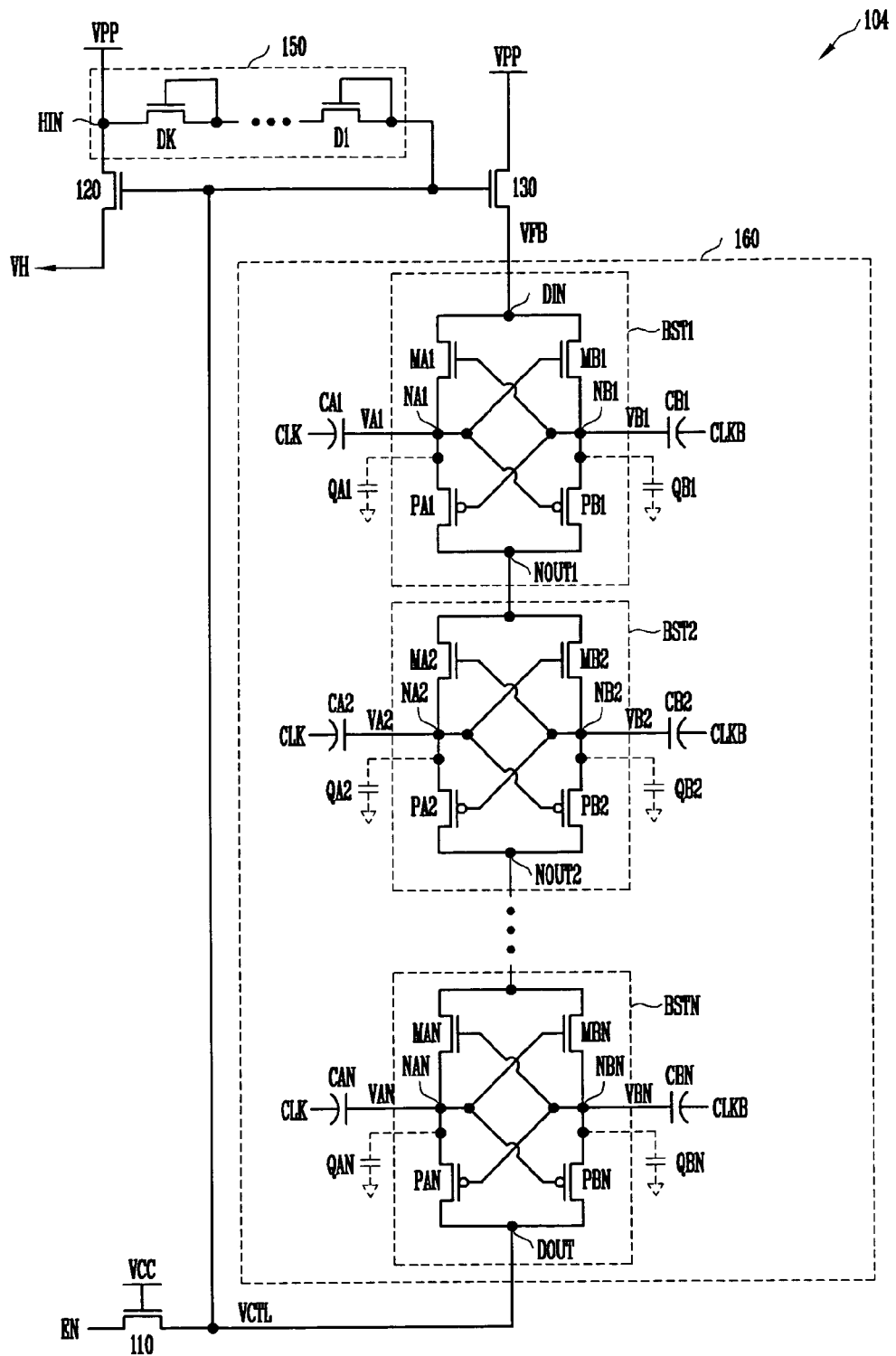
FIG. 8 is a circuit diagram of a high-voltage switch circuit according to one embodiment of the present invention.

FIG. 8 is a circuit diagram of a high-voltage switch circuit according to one embodiment of the present invention. Referring to FIG. 8, a high-voltage switch circuit 104 includes an enable control circuit 110, a high voltage switch 120, a feedback circuit 130, a boosting circuit 160, and a voltage limiter 150. The enable control circuit 110, the high voltage switch 120, and the feedback circuit 130 have substantially the same construction. Furthermore, the boosting circuit 160 is substantially the same as that of FIG. 7 and the voltage limiter 150 is substantially the same as that of FIG. 6. Therefore, the description thereof will be omitted.

Figure 9:
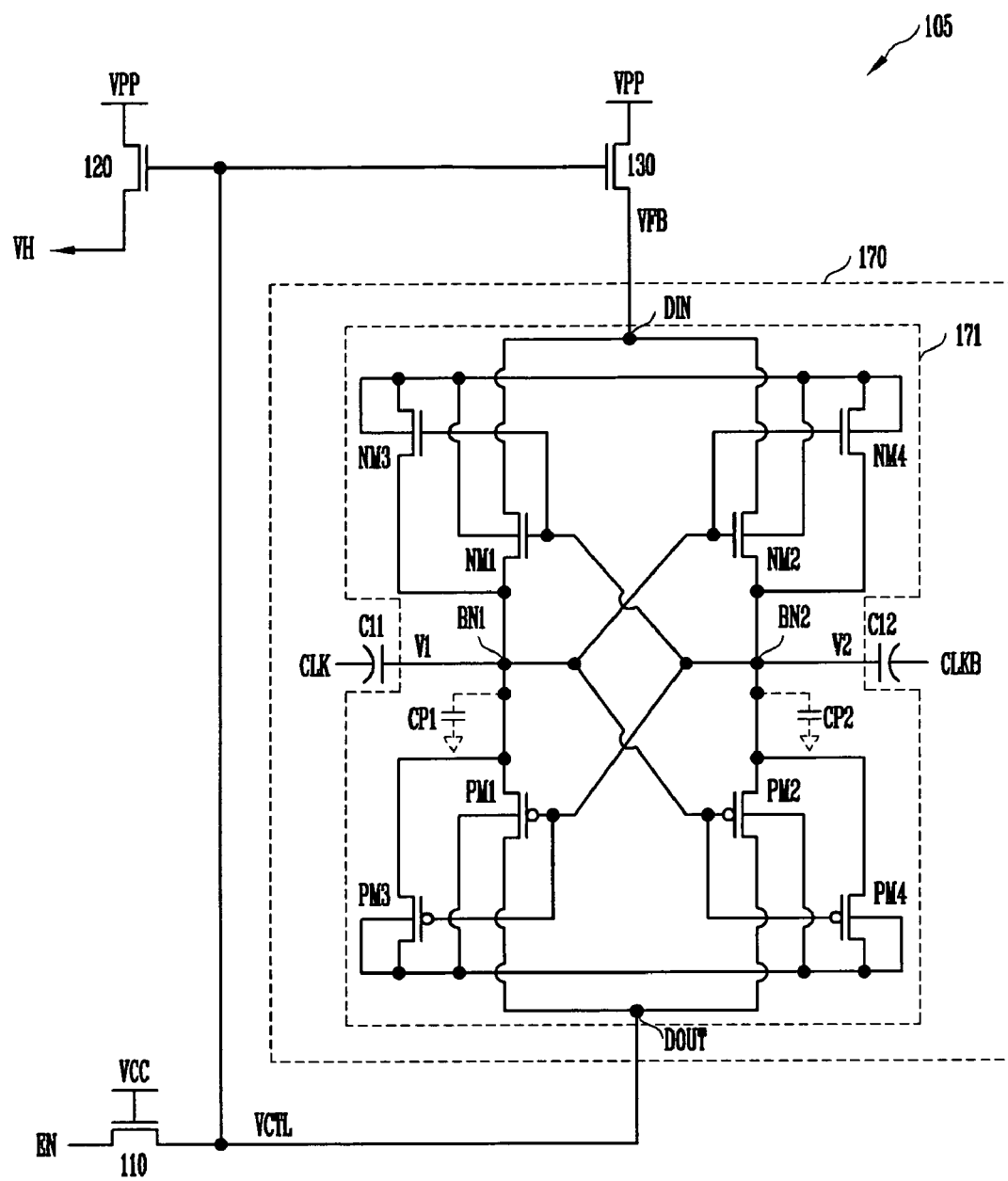
FIG. 9 is a circuit diagram of a high-voltage switch circuit according to one embodiment of the present invention.

FIG. 9 is a circuit diagram of a high-voltage switch circuit according to one embodiment of the present invention. Referring to FIG. 9, a high-voltage switch circuit 105 includes an enable control circuit 110, a high voltage switch 120, a feedback circuit 130, and a boosting circuit 170. The high-voltage switch circuit 105 has similar construction and operation as the high-voltage switch circuit 101 in FIG. 3. T Below are some of the differences between the high-voltage switch circuits 101, 105. The high-voltage switch circuit 105 has switches NM3, NM4, PM3, and PM4 in the amplification circuit 171 of the boosting circuit 170. Each of the switches NM1 to NM4 may be implemented using a low-voltage NMOS transistor and each of the switches PM1 to PM4 may be implemented using a low-voltage PMOS transistor. Hereinafter, it is assumed that each of the switches NM1 to NM4 is an NMOS transistor and each of the switches PM1 to PM4 is a PMOS transistor.

The NMOS transistor NM3 has a drain connected to a boosting node BN1, a gate connected to a boosting voltage V2, and a source connected to the body of NMOS transistors NM1 to NM4. The NMOS transistor NM3 is turned on or off in response to the boosting voltage V2. The NMOS transistor NM3 is turned on to supply the boosting voltage V1 of the boosting node BN1 to the body of the NMOS transistor NM1 and its body. In more detail, when an inverted clock signal CLKB is high and the NMOS transistor NM1 is turned on, the NMOS transistor NM3 supplies the boosting voltage V1 to the body of the NMOS transistors NM1 to NM4. When the inverted clock signal CLKB is high, the clock signal CLK is low. Accordingly, the boosting voltage V1 of the boosting node BN1 can be reduced to a minimal value. As a result, when the NMOS transistor NM1 is turned on, the body of the NMOS transistor NM1 becomes the boosting voltage V1 (i.e., V1=VSS) by means of the NMOS transistor NM3. Therefore, an increase of the threshold voltage of the NMOS transistor NM1 can be reduced. For example, when the voltage of the body of the NMOS transistor NM1 is lower than that of its source, the NMOS transistor NM1 may not operate since the threshold voltage of the NMOS transistor NM1 continues to rise from the body effect. The NMOS transistor NM4 has a drain connected to the boosting node BN2, a gate to which the boosting voltage V1 is input, and a source connected to the body of the NMOS transistors NM1 to NM4. The operation of the NMOS transistor NM4 is the same as that of the NMOS transistor NM3 and will not be described.

The PMOS transistor PM3 has a source connected to the boosting node BN1, a gate to which the boosting voltage V2 is input, and a drain connected to the body of the PMOS transistors PM1 to PM4. The PMOS transistor PM3 is turned on or off in response to the boosting voltage V2. The PMOS transistor PM3 is turned on to supply the boosting voltage V1 to the body of the PMOS transistors PM1 to PM4. In more detail, when the inverted clock signal CLKB is low and the PMOS transistor PM1 is turned on accordingly, the PMOS transistor PM3 supplies the boosting voltage V1 to the body of the PMOS transistors PM1 to PM4. Since the clock signal CLK is high when the inverted clock signal CLKB is low, the boosting voltage V1 of the boosting node BN1 can be increased. At this time, the boosting voltage V1 has been amplified as represented by Equation 6 since the NMOS transistor NM1 has been turned on. As a result, when the PMOS transistor PM1 is turned on, the body of the PMOS transistor PM1 becomes the boosting voltage V1 by the PMOS transistor PM3. Accordingly, an increase of the threshold voltage of the PMOS transistor PM1 can be reduced. For example, when the voltage of the body of the PMOS transistor PM1 is lower than the voltage of its drain, the PMOS transistor PM1 may not operate since the threshold voltage of the PMOS transistor PM1 continues to rise from the body effect.

The PMOS transistor PM4 has a source connected to the boosting node BN2, a gate to which the boosting voltage V1 is input, and a drain connected to the body of the PMOS transistors PM1 to PM4. The operation of the PMOS transistor PM4 is similar to that of the PMOS transistor PM3 and will not be described.

As described above, the NMOS transistors NM3, NM4 and the PMOS transistors PM3, PM4 can reduce the threshold voltage increase of the NMOS transistors NM1, NM2 and the PMOS transistors PM1, PM2 from the body effect. Accordingly, the boosting circuit 170 can increase the switch control voltage VCTL rapidly compared with the boosting circuit 140. Consequently, the operating speed of the high-voltage switch circuit 105 can be increased in comparison with the high-voltage switch circuit 101.

Figure 10:
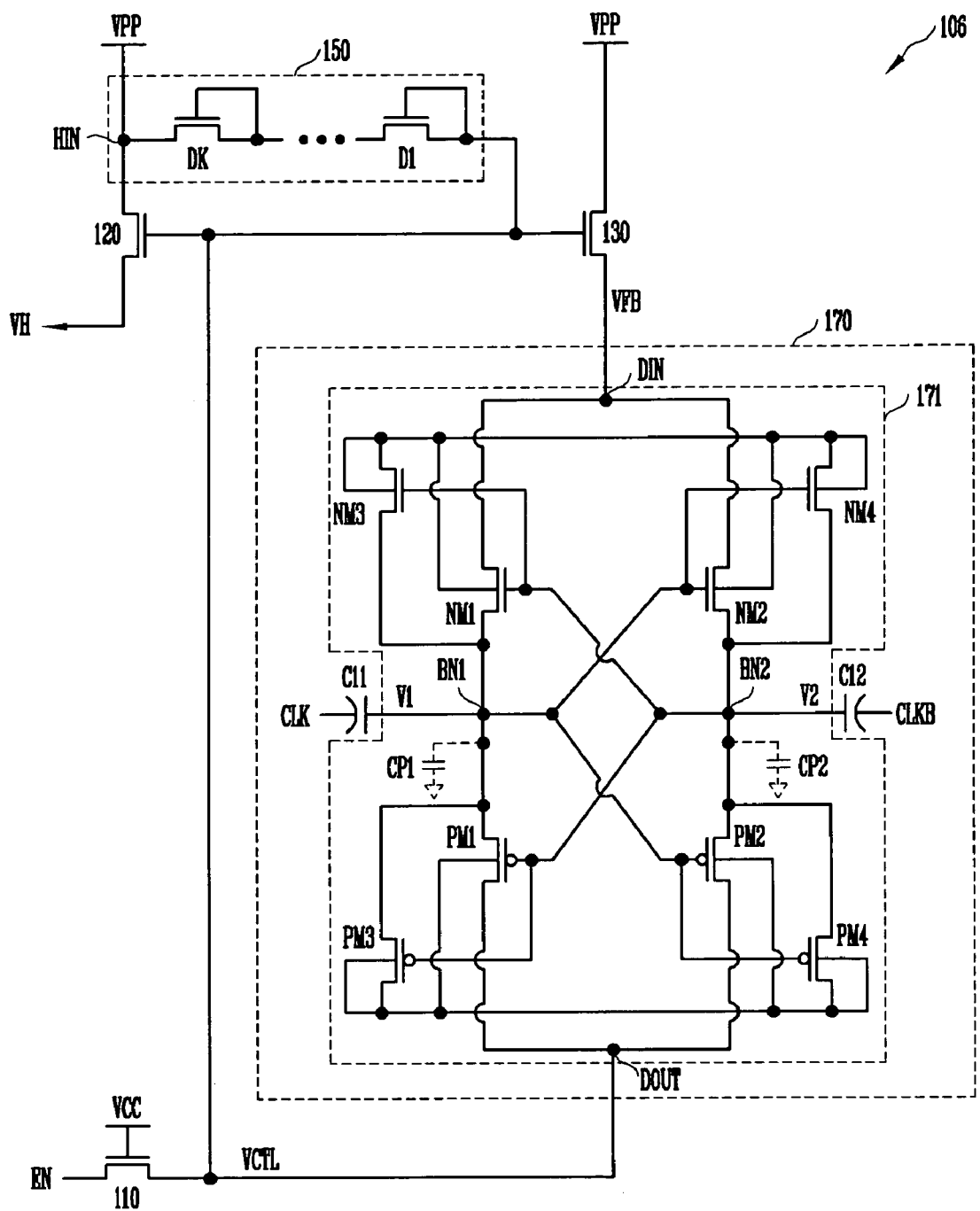
FIG. 10 is a circuit diagram of a high-voltage switch circuit according to one embodiment of the present invention.

FIG. 10 is a circuit diagram of a high-voltage switch circuit according to one embodiment of the present invention. Referring to FIG. 10, a high-voltage switch circuit 106 includes an enable control circuit 110, a high voltage switch 120, a feedback circuit 130, a boosting circuit 170, and a voltage limiter 150. The enable control circuit 110, the high voltage switch 120, and the feedback circuit 130 have substantially the same construction as those in FIG. 3. Description thereof will be omitted for simplicity. Furthermore, the boosting circuit 170 is similar to that of FIG. 9 and the voltage limiter 150 is similar to that of FIG. 6. Accordingly, the boosting circuit 170 and the voltage limiter 150 will not be described.

Figure 11:
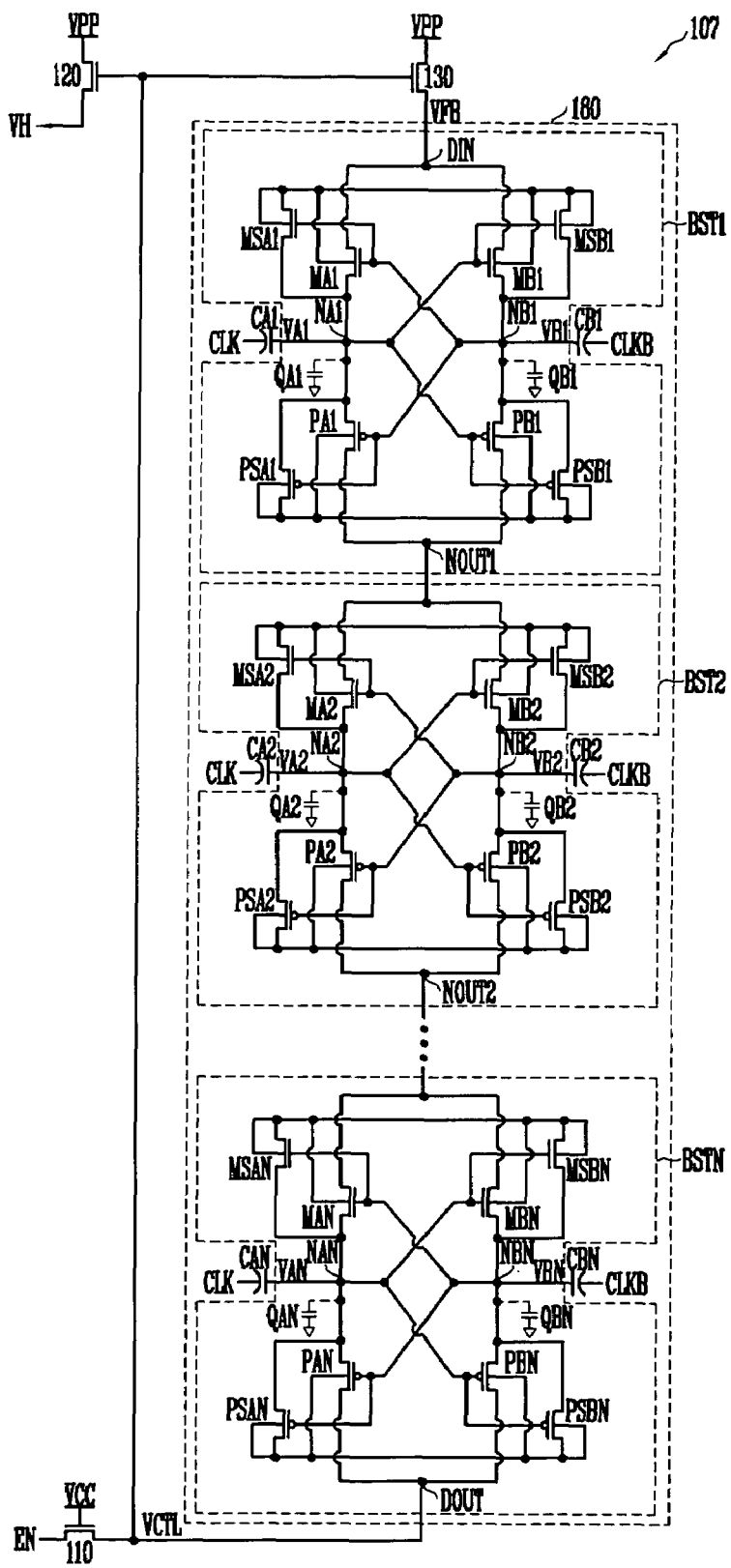
FIG. 11 is a circuit diagram of a high-voltage switch circuit according to one embodiment of the present invention.

FIG. 11 is a circuit diagram of a high-voltage switch circuit according to one embodiment of the present invention. Referring to FIG. 11, the high-voltage switch circuit 107 includes an enable control circuit 110, a high voltage switch 120, a feedback circuit 130, and a boosting circuit 180. The high-voltage switch circuit 107 has similar construction as the high-voltage switch circuit 105 in FIG. 9. In the present embodiment, only the difference between the high-voltage switch circuits 105, 107 will be described.

The difference between the high-voltage switch circuits 105, 107 is the addition of multiple amplification circuits BST1 to BSTN and a plurality of capacitors CA1 to CAN, CB1 to CBN in the boosting circuit 180 of the high-voltage switch circuit 107. The construction and operation of the capacitors CA1 to CAN, CB1 to CBN are similar to those of the capacitors CA1 to CAN, CB1 to CBN of the high-voltage switch circuit 103. Each of the amplification circuits BST1 to BSTN has substantially the same construction as that of the amplification circuit 171 in FIG. 9.

As described above, the boosting circuit 180 includes the plurality of amplification circuits BST1 to BSTN. Accordingly, the boosting circuit 180 can increase the switch control voltage VCTL rapidly in comparison with the boosting circuit 170. Consequently, the operating speed of the high-voltage switch circuit 107 can be increased further in comparison with the high-voltage switch circuit 105.

Figure 12:
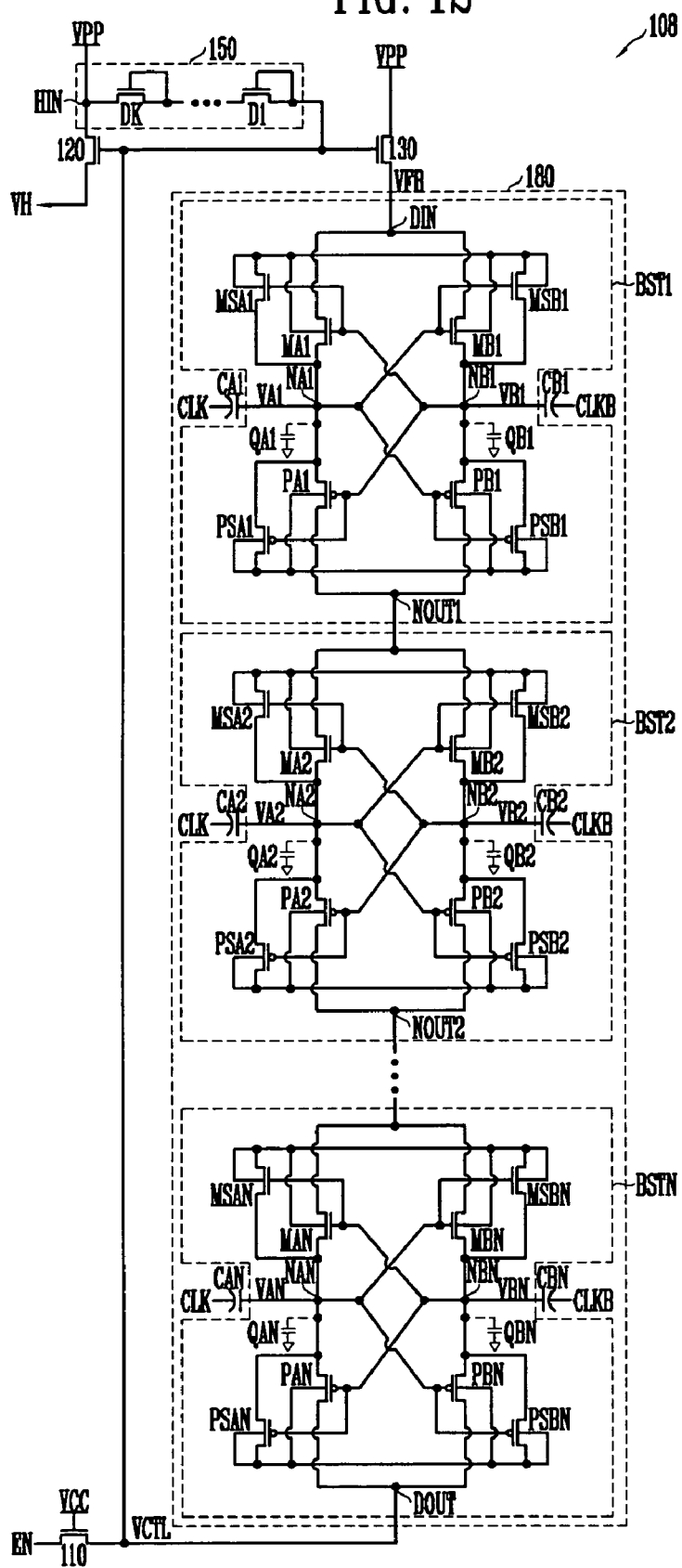
FIG. 12 is a circuit diagram of a high-voltage switch circuit according to an eighth embodiment of the present invention.

FIG. 12 is a circuit diagram of a high-voltage switch circuit according to an eighth embodiment of the present invention. Referring to FIG. 12, a high-voltage switch circuit 108 includes an enable control circuit 110, a high voltage switch 120, a feedback circuit 130, a boosting circuit 180, and a voltage limiter 150. The enable control circuit 110, the high voltage switch 120, and the feedback circuit 130 have substantially the same construction as those in FIG. 3. The boosting circuit 180 is similar to that of FIG. 11 and the voltage limiter 150 is similar to that in FIG. 6. Accordingly, the boosting circuit 180 and the voltage limiter 150 will not be described.

Figure 13:
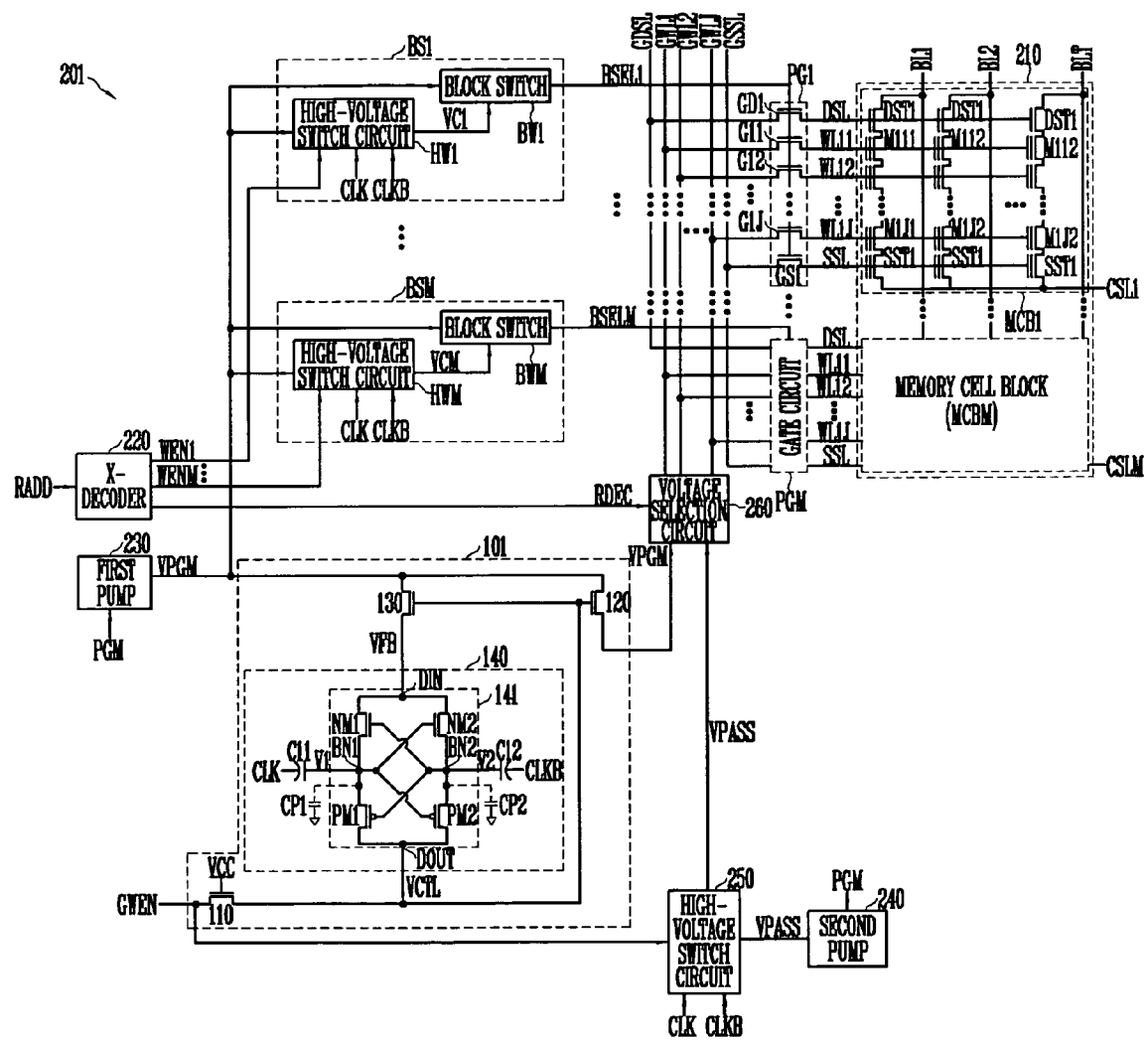
FIG. 13 is a schematic block diagram of a flash memory device according to one embodiment of the present invention.

FIG. 13 is a schematic block diagram of a flash memory device according to one embodiment of the present invention. Referring to FIG. 13, a flash memory device 201 includes a memory cell array 210, a X-decoder 220, a plurality of block selection units BS1 to BSM (M is an integer), a plurality of gate circuits PG1 to PBM (M is an integer), a first pump 230, a second pump 240, a voltage selection circuit 260, and high-voltage switch circuits 101, 250.

The memory cell array 210 includes a plurality of memory cell blocks MCB1 to MCBM (M is an integer). Each of the plurality of memory cell blocks MCB1 to MCBM includes a plurality of memory cells M111 to M1JT that share local word lines WL11 to W1J and bit lines BL1 to BLT (T is an integer).

The X-decoder 220 decodes a row address signal RADD and outputs first decoding signals WEN1 to WENM (M is an integer) and a second decoding signal RDEC. The decoding signals WEN1 to WENM are input into a plurality of block selection units BS1 to BSM, respectively. The block selection units BS1 to BSM then outputs a plurality of block selection signals BSEL1 to BSELM (M is an integer), respectively, in response to the input signals. In more detail, each of the plurality of block selection units BS1 to BSM includes a block switch (one of BW1 to BWM) and a high-voltage switch circuit (one of HW1 to HWM). Since the plurality of block selection units BS1 to BSM have substantially the same construction and operation, only the construction and operation of the block selection unit BS1 will be described below as an example.

The block selection unit BS1 includes the block switch BW1 and the high-voltage switch circuit HW1. The block switch BW1 receives a program voltage VPGM and outputs the block selection signal BSEL1 with a voltage level that is higher than the program voltage VPGM or lower than the program voltage VPGM in response to a block switch control voltage VC1. The high-voltage switch circuit HW1 receives the program voltage VPGM, and outputs the program voltage VPGM as the block switch control voltage VC1 in response to the first decoding signal WEN1 and the clock signals CLK, CLKB.

As an example, when the first decoding signal WEN is high, the high-voltage switch circuit HW1 is turned on to output the program voltage VPGM as the block switch control voltage VC1. Furthermore, when the first decoding signal WEN1 is low, the high-voltage switch circuit HW1 is turned off. Meanwhile, when the high-voltage switch circuit HW1 outputs the program voltage VPGM as the block switch control voltage VC1, the block switch BW1 outputs the block selection signal BSEL1 as a voltage level higher than the program voltage VPGM. Furthermore, when the high-voltage switch circuit HW1 is turned off, the block switch BW1 outputs the block selection signal BSEL1 with a voltage level lower than the program voltage VPGM.

The plurality of gate circuits PG1 to PBM are controlled by block selection signals BSEL1 to BSELM, respectively. The plurality of gate circuits PG1 to PBM connects global drain selection lines GDSL to local drain selection lines DSL; global source select lines GSSL to local source selection lines SSL; and global word lines GWL1 to GWLJ to local word lines WL11 to WL1J of the memory cell blocks MCB1 to MCBM, respectively. The construction and operation of the plurality of gate circuits PG1 to PBM are similar and only PG1 will be described as an example. The gate circuit PG1 may include NMOS transistors GD1, G11 to G1J, and GS1. The NMOS transistor GD1 is connected between the global drain selection line GDSL and the local drain selection line DSL and is turned on or off in response to the block selection signal BSEL1. The NMOS transistors G11 to G1J are connected between the global word lines GWL1 to GWLJ and the local word lines WL11 to WL1J, respectively, and are turned on or off in response to the block selection signal BSEL1. The NMOS transistor GS1 is connected between the global source select line GSSL and the local source select line SSL and is turned on or off in response to the block selection signal BSEL1.

The first pump 230 generates the program voltage VPGM in response to the program command PGM. The second pump 240 generates a program pass voltage VPASS in response to the program command PGM. The voltage selection circuit 260 selects one of the global word lines GWL1 to GWLJ in response to a second decoding signal RDEC, and supplies the program voltage VPGM to a selected global word line and the program pass voltage VPASS to the remaining global word lines.

The high-voltage switch circuit 101 supplies the program voltage VPGM to the voltage selection circuit 260 in response to an enable control signal GWEN and the clock signals CLK, CLKB. For example, when the enable control signal GWEN is high, the high-voltage switch circuit 101 is turned on to supply the program voltage VPGM to the voltage selection circuit 260. Furthermore, when the enable control signal GWEN is low, the high-voltage switch circuit 101 is turned off to stop the supplying the program voltage VPGM.

The high-voltage switch circuit 101 includes an enable control circuit 110, a high voltage switch 120, a feedback circuit 130, and a boosting circuit 140. The construction and operation of the high-voltage switch circuit 101 are similar to those of FIG. 3 and will not be described.

The high-voltage switch circuit 250 supplies the program pass voltage VPASS to the voltage selection circuit 260 in response to the enable control signal GWEN and the clock signals CLK, CLKB. For example, when the enable control signal GWEN is high, the high-voltage switch circuit 250 is turned on to supply the program pass voltage VPASS to the voltage selection circuit 260. Furthermore, when the enable control signal GWEN is low, the high-voltage switch circuit 250 is turned off to stop the supply operation of the program pass voltage VPASS. Each of the high-voltage switch circuits 250 and HW1 to HWM may be implemented in a similar manner to the high-voltage switch circuit 101.

The program operation of the flash memory device 201 will be described in short below. The first pump 230 generates the program voltage VPGM and the second pump 240 generates the program pass voltage VPASS, in response to the program command PGM. The X-decoder 220 decodes the row address signal RADD and outputs the first decoding signals WEN1 to WENM and the second decoding signal RDEC. For example, when the X-decoder 220 enables the first decoding signal WEN1 and disables the first decoding signals WEN2 to WENM, the high-voltage switch circuit HW1 may be turned on in response to the first decoding signal WEN1 and the clock signals CLK, CLKB and the high-voltage switch circuits HW2 to HWM may be turned off. As a result, the high-voltage switch circuit HW1 receives the program voltage VPGM and outputs it as the block switch control voltage VC1.

The block switch BW1 outputs the block selection signal BSEL1 with a voltage level higher than that of the program voltage VPGEM and a voltage level based on the program voltage VPGM and the block switch control voltage VC1. The NMOS transistors GD1, G11 to G1J, and GS1 of the gate circuit PG1 are all turned on in response to the block selection signal BSEL1, thus connecting the global drain selection line GDSL to the local drain select line DSL; the global source select line GSSL to the local source select line SSL; and the global word lines GWL1 to GWLJ to the local word lines WL11 to WL1J of the memory cell block MCB1, respectively.

Meanwhile, if the enable control signal GWEN is high, the high-voltage switch circuits 101, 250 are turned on in response to the enable control signal GWEN and the clock signals CLK, CLKB. As a result, the high-voltage switch circuits 101, 250 outputs the program voltage VPGM and the program pass voltage VPASS, to the voltage selection circuit 260. The voltage selection circuit 260 selects at least one (e.g., GWL1) of the global word lines GWL1 to GWLJ, and supplies the program voltage VPGM to the selected global word line GWL1 and the program pass voltage VPASS to the remaining global word lines GWL2 to GWLJ, in response to the second decoding signal RDEC.

Consequently, a page of memory cells including the memory cells M111 to M11T connected to the local word line WL11 of the memory cell block MCB1 is programmed. Since the high-voltage switch circuits (101, 250, HW1 to HWM) can perform the switching operation at high speed, the program operation speed of the flash memory device 201 can be increased.

Figure 14:
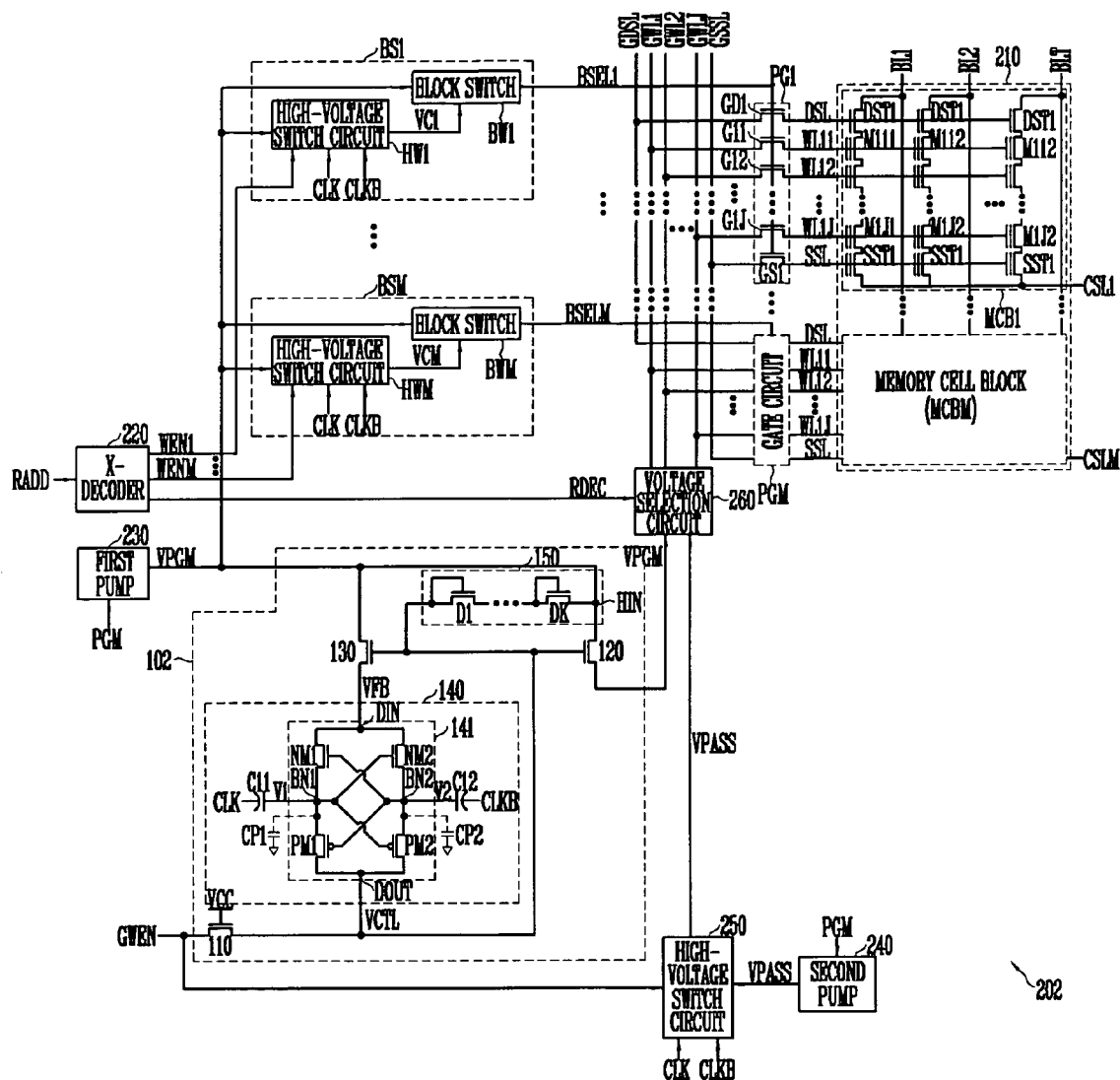
FIG. 14 is a schematic block diagram of a flash memory device according to one embodiment of the present invention.

FIG. 14 is a schematic block diagram of a flash memory device according to one embodiment of the present invention. Referring to FIG. 14, a flash memory device 202 includes a memory cell array 210, a X-decoder 220, a plurality of block selection units BS1 to BSM (M is an integer), a plurality of gate circuits PG1 to PBM (M is an integer), a first pump 230, a second pump 240, a voltage selection circuit 260, and high-voltage switch circuits 102, 250.

The flash memory device 202 has substantially the same construction and operation as those of the flash memory device 201 shown in FIG. 13. One of the differences between the flash memory devices 201, 202 is that the high-voltage switch circuit 250 includes a voltage limiter (such as the voltage limiter 150). Each of the high-voltage switch circuits 250, and HW1 to HWM) may be implemented using the high-voltage switch circuit 102 or 101.

Figure 15:
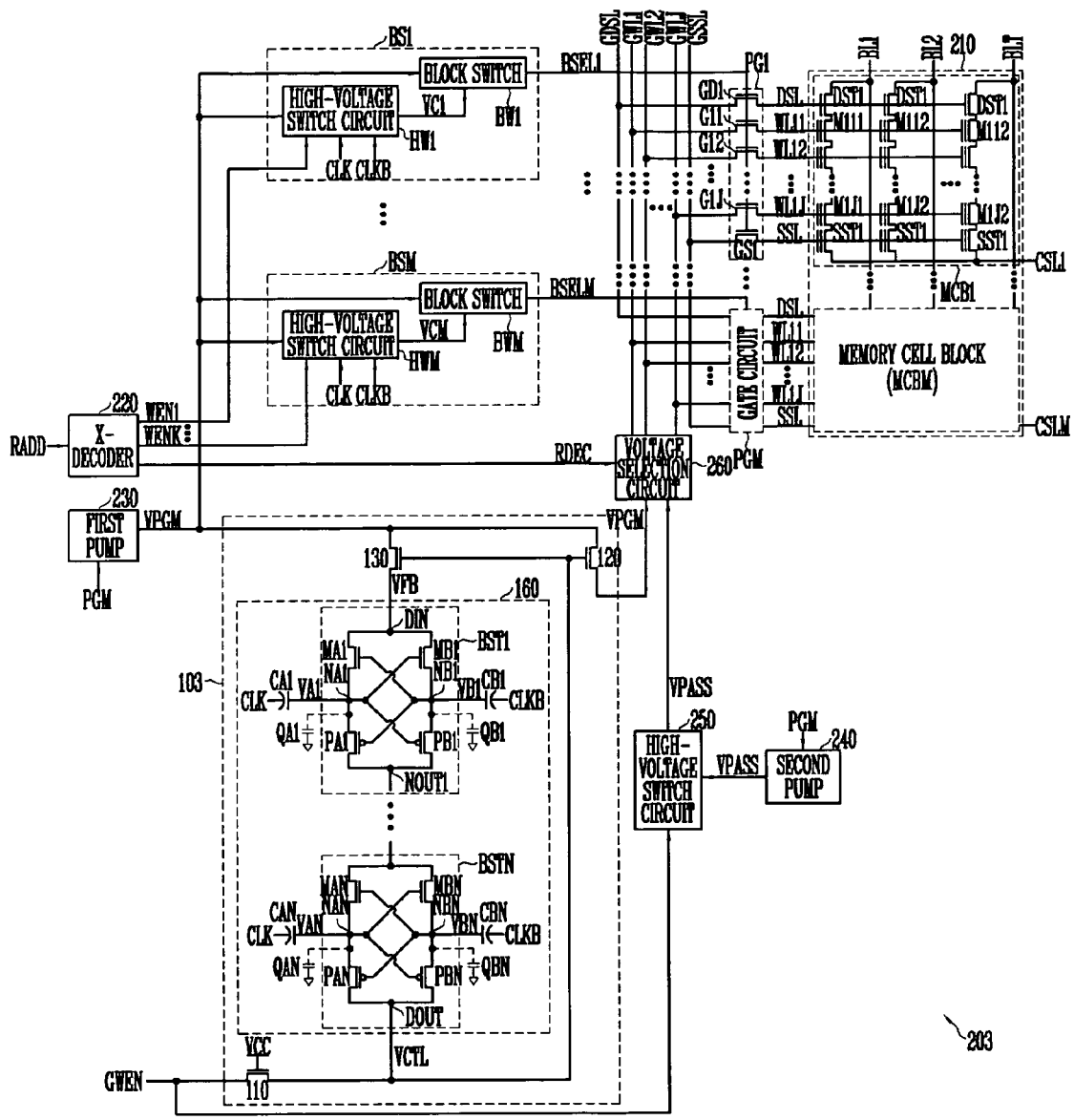
FIG. 15 is a schematic block diagram of a flash memory device according to one embodiment of the present invention.

FIG. 15 is a schematic block diagram of a flash memory device according to one embodiment of the present invention. Referring to FIG. 15, a flash memory device 203 includes a memory cell array 210, a X-decoder 220, a plurality of block selection units BS1 to BSM (M is an integer), a plurality of gate circuits PG1 to PBM (M is an integer), a first pump 230, a second pump 240, a voltage selection circuit 260, and high-voltage switch circuits 103, 250. The flash memory device 203 has similar construction and operation as the flash memory device 201 shown in FIG. 13. One of the differences between the flash memory devices 201, 203 is that the boosting circuit 160 of the high-voltage switch circuit 103 includes a plurality of capacitors CA1 to CAN, CB1 to CBN (N is an integer) and a plurality of amplification circuits BST1 to BSTN (N is an integer). The construction and operation of the high-voltage switch circuit 103 is similar to the high-voltage switch circuit 103 shown in FIG. 7. In this case, each of the high-voltage switch circuits 250 and HW1 to HWM may be implemented in a similar way to one of the high-voltage switch circuits 101 to 103.

Figure 16:
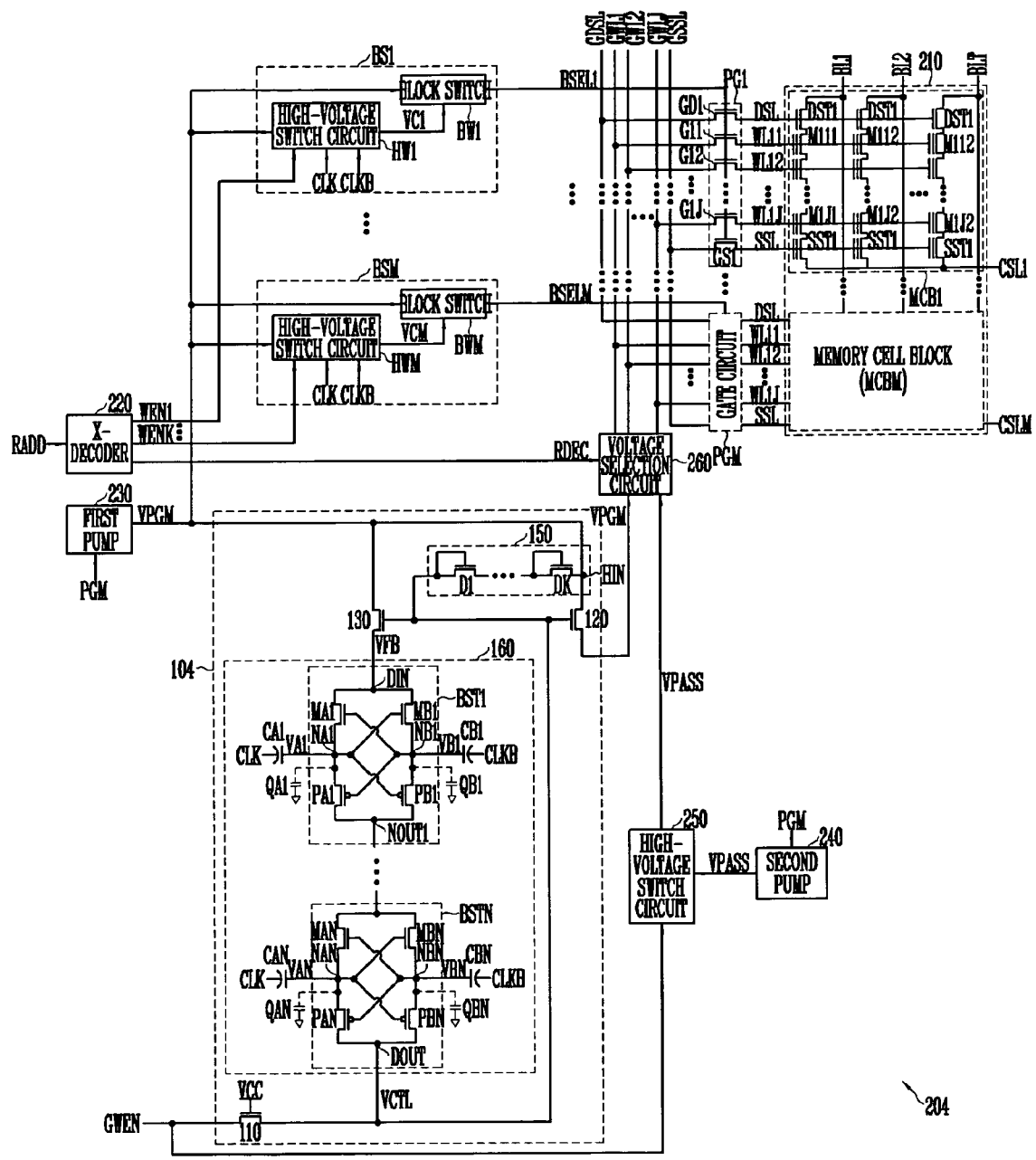
FIG. 16 is a schematic block diagram of a flash memory device according to one embodiment of the present invention.

FIG. 16 is a schematic block diagram of a flash memory device according to one embodiment of the present invention. Referring to FIG. 16, a flash memory device 204 includes a memory cell array 210, a X-decoder 220, a plurality of block selection units BS1 to BSM (M is an integer), a plurality of gate circuits PG1 to PBM (M is an integer), a first pump 230, a second pump 240, a voltage selection circuit 260, and high-voltage switch circuits 104, 250. The flash memory device 204 has similar construction and operation as the flash memory device 203 shown in FIG. 15. One of the differences between the flash memory devices 203, 204 is the addition of the voltage limiter 150 in the high-voltage switch circuit 104. The construction and operation of the high-voltage switch circuit 104 is similar to the high-voltage switch circuit 104 shown in FIG. 8. In this case, each of the high-voltage switch circuits 250 and HW1 to HWM may be implemented in a similar way to one of the high-voltage switch circuits 101 to 104.

Figure 17:
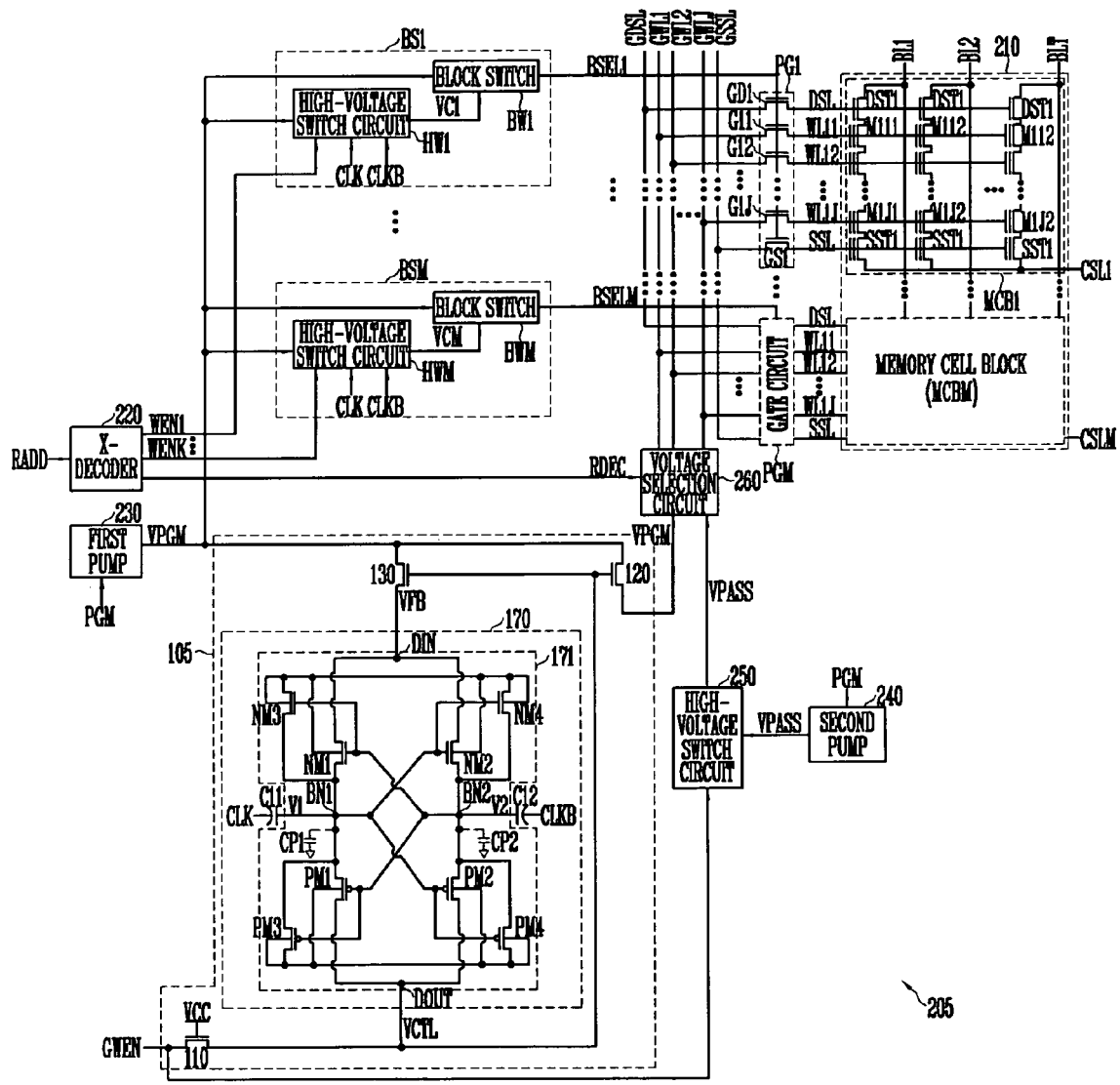
FIG. 17 is a schematic block diagram of a flash memory device according to one embodiment of the present invention.

FIG. 17 is a schematic block diagram of a flash memory device according to one embodiment of the present invention. Referring to FIG. 17, a flash memory device 205 includes a memory cell array 210, a X-decoder 220, a plurality of block selection units BS1 to BSM (M is an integer), a plurality of gate circuits PG1 to PBM (M is an integer), a first pump 230, a second pump 240, a voltage selection circuit 260, and high-voltage switch circuits 105, 250. The flash memory device 205 has similar construction and operation as the flash memory device 201 shown in FIG. 13. One of the differences between the flash memory devices 201, 205 is the addition of the switches NM3, NM4, PM3 and PM4 in the high-voltage switch circuit 105. The construction and operation of the high-voltage switch circuit 105 are the same as the high-voltage switch circuit 105 shown in FIG. 9. In this case, each of the high-voltage switch circuits 250 and HW1 to HWM may be implemented in a similar way to one of the high-voltage switch circuits 101 to 105.

Figure 18:
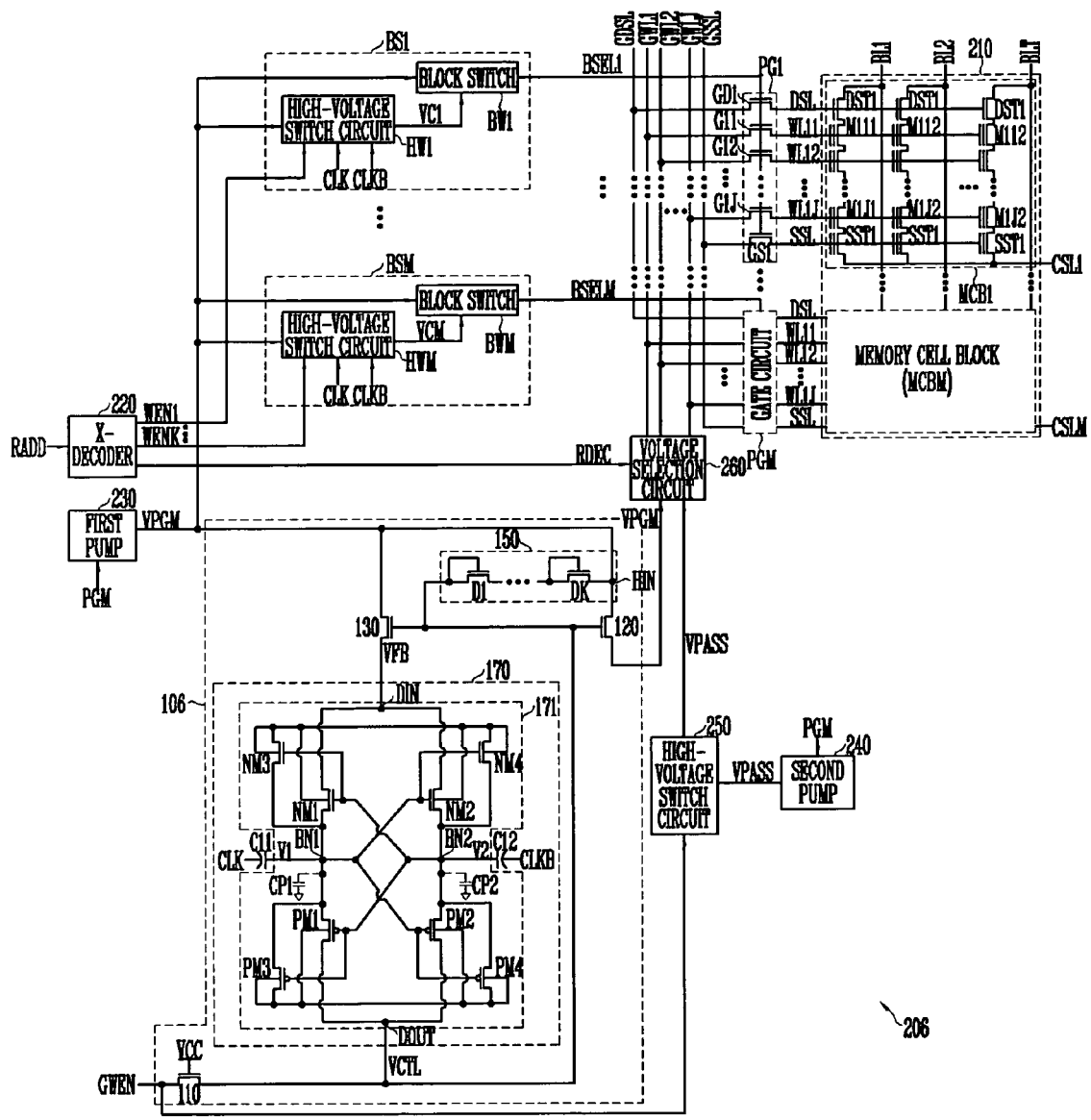
FIG. 18 is a schematic block diagram of a flash memory device according to one embodiment of the present invention.

FIG. 18 is a schematic block diagram of a flash memory device according to one embodiment of the present invention. Referring to FIG. 18, a flash memory device 206 includes a memory cell array 210, a X-decoder 220, a plurality of block selection units BS1 to BSM (M is an integer), a plurality of gate circuits PG1 to PBM (M is an integer), a first pump 230, a second pump 240, a voltage selection circuit 260, and high-voltage switch circuits 106, 250. The flash memory device 206 has similar construction and operation as the flash memory device 205 shown in FIG. 17. One of the differences between the flash memory devices 205, 206 is the addition of the voltage limiter 150 in the high-voltage switch circuit 106. The construction and operation of the high-voltage switch circuit 106 are the same as the high-voltage switch circuit 106 shown in FIG. 10. In this case, each of the high-voltage switch circuits 250 and HW1 to HWM may be implemented in a similar way to one of the high-voltage switch circuits 101 to 106.

Figure 19:
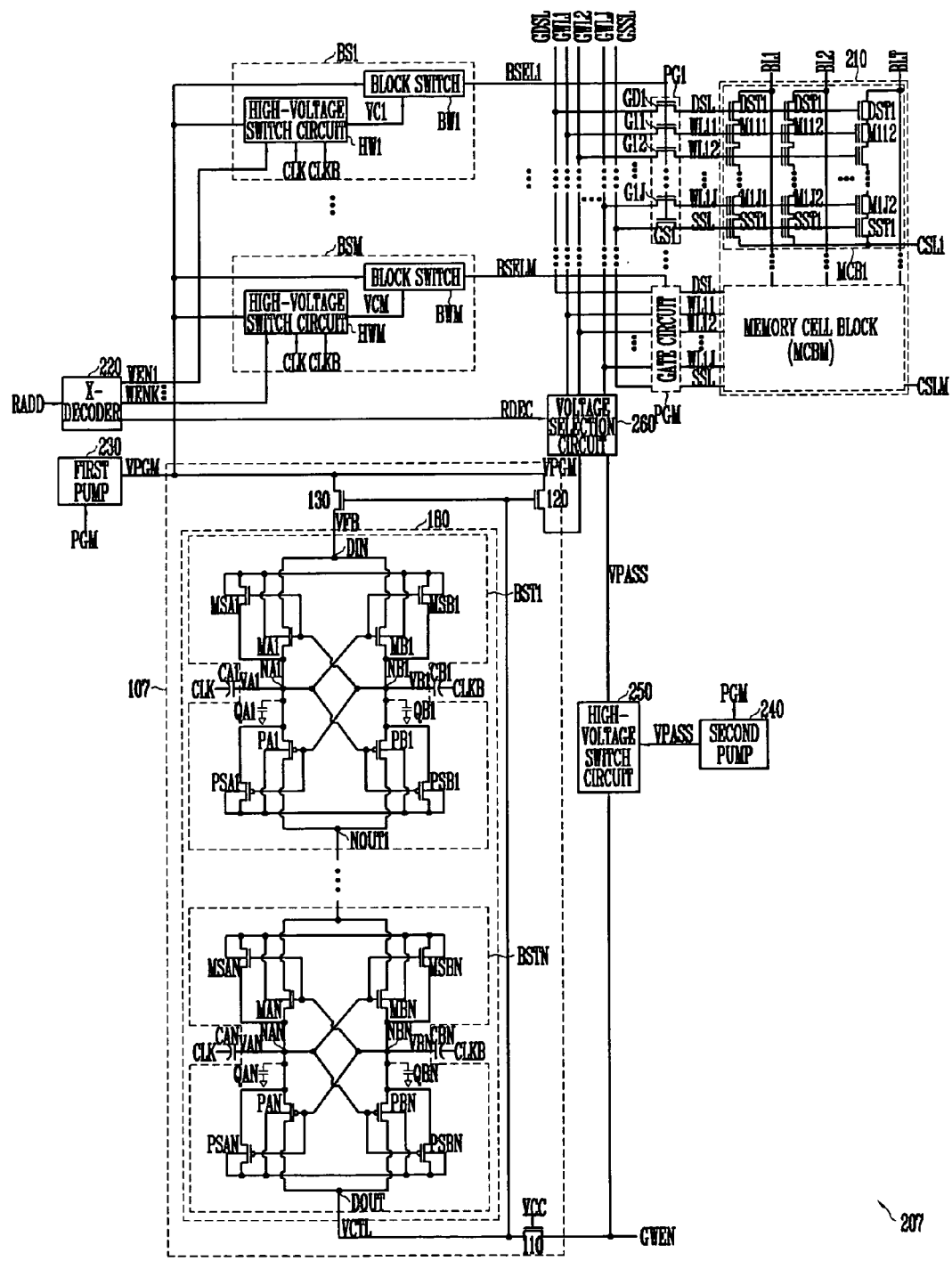
FIG. 19 is a schematic block diagram of a flash memory device according to one embodiment of the present invention.

FIG. 19 is a schematic block diagram of a flash memory device according to one embodiment of the present invention. Referring to FIG. 19, a flash memory device 207 includes a memory cell array 210, a X-decoder 220, a plurality of block selection units BS1 to BSM (M is an integer), a plurality of gate circuits PG1 to PBM (M is an integer), a first pump 230, a second pump 240, a voltage selection circuit 260, and high-voltage switch circuits 107, 250. The flash memory device 207 has similar construction and operation as the flash memory device 205 shown in FIG. 17.

One of the differences between the flash memory devices 205, 207 is that the boosting circuit 180 of the high-voltage switch circuit 107 includes a plurality of capacitors CA1 to CAN, CB1 to CBN (N is an integer) and a plurality of amplification circuits BST1 to BSTN (N is an integer). The construction and operation of the high-voltage switch circuit 107 is similar to the high-voltage switch circuit 107 shown in FIG. 11. In this case, each of the high-voltage switch circuits 250 and HW1 to HWM may be implemented in a similar way to one of the high-voltage switch circuits 101 to 107.

Figure 20:
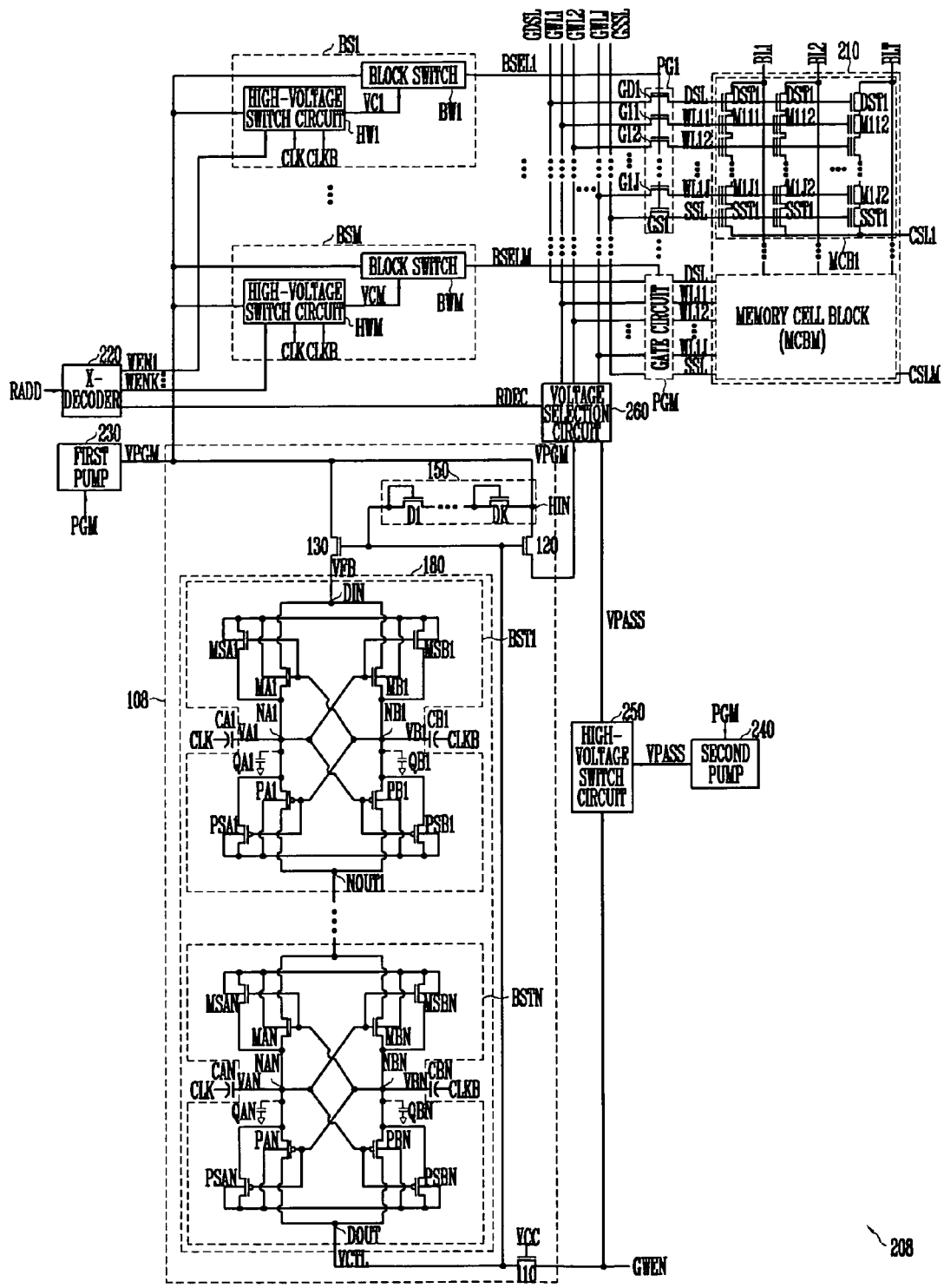
FIG. 20 is a schematic block diagram of a flash memory device according to an eighth embodiment of the present invention.

FIG. 20 is a schematic block diagram of a flash memory device according to an eighth embodiment of the present invention. Referring to FIG. 20, a flash memory device 208 includes a memory cell array 210, a X-decoder 220, a plurality of block selection units BS1 to BSM (M is an integer), a plurality of gate circuits PG1 to PBM (M is an integer), a first pump 230, a second pump 240, a voltage selection circuit 260, and high-voltage switch circuits 108, 250. The flash memory device 208 has similar construction and operation as the flash memory device 207 shown in FIG. 19. One of the differences between the flash memory devices 207, 208 is the addition of the voltage limiter 150 in the high-voltage switch circuit 108. The construction and operation of the high-voltage switch circuit 108 are similar to the high-voltage switch circuit 108 shown in FIG. 12. In this case, each of the high-voltage switch circuits 250 and HW1 to HWM may be implemented in a similar way to one of the high-voltage switch circuits 101 to 108.

As described above, the high-voltage switch circuits 101 to 108, 250, HW1 to HWM included in the flash memory devices 201 to 208 can perform the switching operation at high speed. Accordingly, the program operation speed of the flash memory device can be enhanced and noise components of an output high voltage can be reduced.

Furthermore, in the above-mentioned embodiments, constituent elements for the program operation of the flash memory device and the operations of the constituent elements have been described as examples. However, the above-mentioned embodiments may be applied to a variety of operations, such as an erase operation or a read operation of the flash memory device that executes the switching operation of a high voltage.

While the invention has been described in connection with what is presently considered to be specific embodiments, it is to be understood that the invention is not limited to the disclosed embodiments, but, on the contrary, is intended to cover various modifications and equivalent arrangements included within the spirit and scope of the appended claims.

What is claimed is:

1. A high-voltage switch circuit comprising:
   an enable control circuit to precharge a first node to a given voltage in response to an enable signal;
   a feedback circuit to supply a feedback voltage to a second node in response to a switch control voltage corresponding to the first voltage;
   a cross-coupled amplification circuit to boost the feedback voltage, output a amplified voltage to the first node in response to control signals and increase the switch control voltage, wherein the control signals comprises first and second clock signals that are complementary, the cross-coupled amplification circuit comprises:
   a first capacitor connected to a first boosting node and charged or discharge in response to the first clock signal; and
   a second capacitor connected to a second boosting node and charged or discharge in response to the second clock signal,
   wherein when the first capacitor is charged, a first boosting voltage of the first boosting node is increased by a first voltage level, and when the second capacitor is charged, a second boosting voltage of the second boosting node is increased by a second voltage level, and
   wherein the amplified voltage corresponds the first or second boosting voltage according to a clock cycle;
   a high voltage switch that is turned on or off in response to the switch control voltage, the high voltage switch being configured to output a second voltage when the high voltage switch is turned on; and
   a voltage limiter coupled to the second node, the voltage limiter being configured to reduce the switch control voltage so that the switch control voltage is kept below a given voltage level.

2. The high-voltage switch circuit of claim 1, wherein the enable control circuit includes an NMOS transistor having a gate to which an internal voltage is input, a drain to which the enable signal is input, and a source coupled to the first node, and
   wherein the internal voltage is higher than the first voltage and lower than the second voltage.

3. The high-voltage switch circuit of claim 1, wherein the feedback circuit includes an NMOS transistor to which the second voltage is input, a gate to which the switching control voltage is input, and a source connected to the second node.

4. The high-voltage switch circuit of claim 1, wherein the high voltage switch comprises an NMOS transistor for a high voltage having a drain to which the second voltage is input and a gate to which the switch control voltage is input, and wherein when the NMOS transistor is fully turned on, the NMOS transistor outputs the second voltage to its source.

5. The high-voltage switch circuit of claim 1, wherein the first voltage level is associated with the feedback voltage, a voltage of the first clock signal, and coupling capacitance of the first boosting node, and the second voltage level is associated with the feedback voltage, a voltage of the second clock signal, and coupling capacitance of the second boosting node, and wherein the coupling capacitance of the first boosting node is associated with capacitance of the first capacitor and capacitance of a first parasitic capacitor of the first boosting node, and the coupling capacitance of the second boosting node is associated with capacitance of the second capacitor and capacitance of a second parasitic capacitor of the second boosting node.

6. The high-voltage switch circuit of claim 1, wherein the amplification circuit alternately amplifies the first and second boosting voltages based on the feedback voltage and the voltages of the first and second clock signals and outputs the first or second boosting voltage that has been amplified to the first node as the amplified voltage in response to the feedback voltage input to the second node, wherein the first node is an output node and the second node is an input node.

7. The high-voltage switch circuit of claim 1, wherein the amplification circuit comprises:
   a first switch connected between the second node and the first boosting node and turned on or off in response to the second boosting voltage;
   a second switch connected between the second node and the second boosting node and turned on or off in response to the first boosting voltage;
   a third switch connected between the first boosting node and the first node and turned on or off in response to the second boosting voltage; and
   a fourth switch connected between the second boosting node and the first node and turned on or off in response to the first boosting voltage circuit.

8. The high-voltage switch circuit of claim 7, wherein each of the first and second switches comprises a low-voltage NMOS transistor.

9. The high-voltage switch circuit of claim 7, wherein each of the third and fourth switches comprises a low-voltage PMOS transistor.

10. The high-voltage switch circuit of claim 1, wherein the high voltage switch receives the second voltage through a high-voltage input node, and
   the voltage limiter comprises at least one diode-like device provided between the first node and the high-voltage input node.

11. The high-voltage switch circuit of claim 10, wherein the at least one diode-like device comprises an NMOS transistor having a gate and a drain, the gate being shorted to the drain.

12. The high-voltage switch circuit of claim 8, wherein the amplification circuit comprises:
   a fifth switch for supplying the first boosting voltage to a body of a first NMOS transistor included in the first switch in response to the second boosting voltage; and
   a sixth switch for supplying the second boosting voltage to a body of a second NMOS transistor included in the second switch in response to the second boosting voltage.

13. The high-voltage switch circuit of claim 9, wherein the amplification circuit comprises:

a fifth switch for supplying the first boosting voltage to a body of a first PMOS transistor included in the third switch in response to the second boosting voltage; and
   a sixth switch for supplying the second boosting voltage to a body of a second PMOS transistor included in the fourth switch in response to the second boosting voltage.

14. The high-voltage switch circuit of claim 1, wherein the enable control circuit precharges the first node to the given voltage when the enable signal is in a first state, and discharges the second node to a ground voltage when the enable signal is in a second state,
   the feedback circuit stops providing the feedback voltage to the second node when the first node is discharged, and
   the high voltage switch is turned off when the first node is discharged.

15. A high-voltage switch circuit comprising:
   an enable control circuit for precharging an output node to a set voltage in response to an enable signal;
   a feedback circuit for supplying a feedback voltage to an input node in response to a switch control voltage generated from the output node when the output node is precharged;
   a plurality of cross-coupled amplification circuits for sequentially boosting the feedback voltage and outputting a boosting voltage to the output node, in response to clock signals, thereby increasing the switch control voltage, wherein the clock signals comprises first and second clock signals that are complementary, the plurality of cross-coupled amplification circuits comprising first to $N^{th}$ (N is an integer) amplification circuits connected in series between the input node and the output node, wherein each of the plurality of cross-coupled amplification circuits comprises:
      a first capacitor respectively connected to a first boosting node and charged or discharged in response to the first clock signal; and
      a second capacitor connected to a second boosting node and charged or discharged in response to the second clock signal;
   a high voltage switch turned on or off in response to the switch control voltage, when the high voltage switch is turned on to receive a high voltage and output the received high voltage; and
   a voltage limiter connected to the output node, for reducing the switch control voltage so that the switch control voltage is kept to a limit voltage level when the switch control voltage is excessively boosted.

16. The high-voltage switch circuit of claim 15, wherein the enable control circuit includes a NMOS transistor for a high voltage having a gate to which an internal voltage is input, a drain to which the enable signal is input, and a source connected to the output node.

17. The high-voltage switch circuit of claim 15, wherein the feedback circuit includes a NMOS transistor for a high voltage to which the high voltage is input, a gate to which the switching control voltage is input, and a source connected to the input node.

18. The high-voltage switch circuit of claim 15, wherein the high voltage switch comprises a NMOS transistor for a high voltage having a drain to which the high voltage is input and a gate to which the switch control voltage is input, and when the NMOS transistor is fully turned on, the NMOS transistor outputs the high voltage to its source.

19. The high-voltage switch circuit of claim 15, wherein whenever each of the first capacitors is charged, each of the first boosting voltages of the first boosting nodes is increased, and whenever each of the second capacitors is charged, each of the second boosting voltages of the second boosting nodes is increase, and the boosting voltage is the first or second boosting voltage of the $N^{th}$ amplification circuit.

20. The high-voltage switch circuit of claim 19, wherein the first boosting voltage of the first amplification circuit is decided by the feedback voltage, a voltage of the first clock signal, and coupling capacitance of the first boosting node of the first amplification circuit, and the second boosting voltage of the first amplification circuit is decided by the feedback voltage, a voltage of the second clock signal, and coupling capacitance of the second boosting node of the first amplification circuit, each of the first boosting voltages of the second to $N^{th}$ amplification circuits is decided by the first or second boosting voltage of each of the first to $(N-1)^{th}$ amplification circuits, the voltage of the first clock signal, and coupling capacitance of each of the first boosting nodes of the second to $N^{th}$ amplification circuits, each of the second boosting voltages of the second to $N^{th}$ amplification circuits is decided by the first or second boosting voltage of each of the first to $(N-1)^{th}$ amplification circuits, the voltage of the second clock signal, and coupling capacitance of each of the second boosting nodes of the second to $N^{th}$ amplification circuits, and a coupling capacitance of each of the first boosting nodes is decided by capacitance of each of the first capacitors and capacitance of a first parasitic capacitor existing in each of the first boosting nodes, and a coupling capacitance of each of the second boosting nodes is decided by capacitance of each of the second capacitors and capacitance of a second parasitic capacitor existing in each of the second boosting nodes.

21. The high-voltage switch circuit of claim 19, wherein the first to $N^{th}$ amplification circuits comprise first to $N^{th}$ input nodes and first to $N^{th}$ output nodes, respectively, the input node is the first input node, and the output node is the $N^{th}$ output node, each of the first to $N^{th}$ amplification circuits comprises:

a first switch, which is connected between one of the first to $N^{th}$ input nodes and one of the first boosting nodes and turned on or off in response to one of the second boosting voltages;

a second switch, which is connected between one of the first to $N^{th}$ input nodes and one of the second boosting nodes and turned on or off in response to one of the first boosting voltages;

a third switch, which is connected between one of the first to $N^{th}$ input nodes and one of the first boosting nodes and turned on or off in response to one of the second boosting voltages; and a fourth switch, which is connected between one of the first to $N^{th}$ input nodes and one of the second boosting nodes and turned on or off in response to one of the first boosting voltages.

22. The high-voltage switch circuit of claim 21, wherein each of the first and second switches comprises a NMOS transistor for a low voltage circuit.

23. The high-voltage switch circuit of claim 21, wherein each of the third and fourth switches comprises a PMOS transistor for a low voltage.

24. The high-voltage switch circuit of claim 15, wherein the high voltage switch receives the high voltage through a high-voltage input node, and the voltage limiter comprises at least one diode connected between the output node and the high-voltage input node.

25. The high-voltage switch circuit of claim 24, wherein the at least one diode comprises a NMOS transistor for a high voltage having a gate and drain diode-connected to the output node, and a source connected to the high-voltage input node.

26. The high-voltage switch circuit of claim 21, wherein the first switch comprises a first NMOS transistor having a drain connected to one of the first to $N^{th}$ input nodes, a source connected to one of the first boosting nodes, and a drain to which one of the second boosting voltages is input, the second switch comprises a second NMOS transistor having a drain connected to one of the first to $N^{th}$ input nodes, a source connected to one of the second boosting nodes, and a drain to which one of the first boosting voltages is input, each of the first to $N^{th}$ amplification circuits comprises:

a fifth switch for supplying one of the first boosting voltages to the body of the first NMOS transistor in response to one of the second boosting voltages; and a sixth switch for supplying one of the second boosting voltages to the body of the second NMOS transistor in response to one of the first boosting voltages.

27. The high-voltage switch circuit of claim 21, wherein the third switch comprises a first PMOS transistor having a drain connected to one of the first to $N^{th}$ input nodes, a source connected to one of the first boosting nodes, and a drain to which one of the second boosting voltages is input, the fourth switch comprises a second PMOS transistor having a drain connected to one of the first to $N^{th}$ input nodes, a source connected to one of the second boosting nodes, and a drain to which one of the first boosting voltages is input, each of the first to $N^{th}$ amplification circuits comprises:

a fifth switch for supplying one of the first boosting voltages to the body of the first PMOS transistor in response to one of the second boosting voltages; and a sixth switch for supplying one of the second boosting voltages to the body of the second PMOS transistor in response to one of the first boosting voltages.

28. The high-voltage switch circuit of claim 15, wherein the enable control circuit precharges the output node to the set voltage when the enable signal is enabled, and precharges the output node to a ground voltage when the enable signal is disabled, the feedback circuit stops a supply operation of the feedback voltage when the output node is discharged, and the high voltage switch is opened when the output node is discharged.

* * * * *